(12) United States Patent
Kerber et al.

(10) Patent No.: US 9,231,108 B2
(45) Date of Patent: Jan. 5, 2016

(54) SOURCE AND DRAIN DOPING PROFILE CONTROL EMPLOYING CARBON-DOPED SEMICONDUCTOR MATERIAL

(71) Applicant: International Business Machines Corporation, Armonk, NY (US)

(72) Inventors: Pranita Kerber, Slingerlands, NY (US); Viorel Ontalus, Danbury, CT (US); Donald R. Wall, Poughkeepsie, NY (US); Zhengmao Zhu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/489,732

(22) Filed: Sep. 18, 2014

(65) Prior Publication Data

US 2015/0044846 A1    Feb. 12, 2015

Related U.S. Application Data

(62) Division of application No. 13/564,862, filed on Aug. 2, 2012, now Pat. No. 9,059,292.

(51) Int. Cl.
*H01L 21/8234* (2006.01)
*H01L 29/786* (2006.01)
*H01L 29/66* (2006.01)
(Continued)

(52) U.S. Cl.
CPC .. *H01L 29/78618* (2013.01); *H01L 21/823412* (2013.01); *H01L 29/0847* (2013.01); *H01L 29/165* (2013.01); *H01L 29/41783* (2013.01); *H01L 29/665* (2013.01); *H01L 29/6653* (2013.01); *H01L 29/6656* (2013.01); *H01L 29/66575* (2013.01); *H01L 29/66628* (2013.01); *H01L 29/66772* (2013.01); *H01L 29/7834* (2013.01); *H01L 29/78687* (2013.01); *H01L 2029/7858* (2013.01)

(58) Field of Classification Search
CPC .............................................. H01L 21/823412
See application file for complete search history.

(56) References Cited

U.S. PATENT DOCUMENTS 7,646,071 B2   1/2010   Ban et al.
7,829,951 B2   11/2010  Song et al.
(Continued)

*Primary Examiner* — Peniel M Gumedzoe
*Assistant Examiner* — Christopher Johnson
(74) *Attorney, Agent, or Firm* — Scully, Scott, Murphy & Presser P.C.; Steven J. Meyers

(57) ABSTRACT

Carbon-doped semiconductor material portions are formed on a subset of surfaces of underlying semiconductor surfaces contiguously connected to a channel of a field effect transistor. Carbon-doped semiconductor material portions can be formed by selective epitaxy of a carbon-containing semiconductor material layer or by shallow implantation of carbon atoms into surface portions of the underlying semiconductor surfaces. The carbon-doped semiconductor material portions can be deposited as layers and subsequently patterned by etching, or can be formed after formation of disposable masking spacers. Raised source and drain regions are formed on the carbon-doped semiconductor material portions and on physically exposed surfaces of the underlying semiconductor surfaces. The carbon-doped semiconductor material portions locally retard dopant diffusion from the raised source and drain regions into the underlying semiconductor material regions, thereby enabling local tailoring of the dopant profile, and alteration of device parameters for the field effect transistor.

16 Claims, 35 Drawing Sheets

(51) Int. Cl.
  *H01L 29/08* (2006.01)
  *H01L 29/165* (2006.01)
  *H01L 29/417* (2006.01)
  *H01L 29/78* (2006.01)

(56) References Cited

U.S. PATENT DOCUMENTS

| | | | |
|---|---|---|---|
| 7,927,938 | B2 | 4/2011 | El-Kareh et al. |
| 7,933,142 | B2 | 4/2011 | Okhonin et al. |
| 7,940,559 | B2 | 5/2011 | Carman |
| 7,947,543 | B2 | 5/2011 | Kim |
| 7,957,206 | B2 | 6/2011 | Bauser |
| 7,969,779 | B2 | 6/2011 | Fisch et al. |
| 8,014,195 | B2 | 9/2011 | Okhonin et al. |
| 2004/0217430 | A1 | 11/2004 | Chu |
| 2007/0176223 | A1 | 8/2007 | Chindalore et al. |
| 2009/0026523 | A1 | 1/2009 | Wong et al. |
| 2009/0108314 | A1 | 4/2009 | Cai et al. |
| 2009/0311836 | A1 | 12/2009 | Cartier et al. |
| 2010/0065925 | A1 | 3/2010 | Huang et al. |
| 2010/0329043 | A1 | 12/2010 | Fossum et al. |
| 2011/0024840 | A1 | 2/2011 | Khater |
| 2011/0042744 | A1 | 2/2011 | Cheng et al. |
| 2012/0003801 | A1 | 1/2012 | Izumida et al. |

SOURCE AND DRAIN DOPING PROFILE CONTROL EMPLOYING CARBON-DOPED SEMICONDUCTOR MATERIAL

BACKGROUND

The present disclosure relates to semiconductor devices, and particularly to transistors having a doping profile controlled by carbon-doped semiconductor material portions, and methods of manufacturing the same.

A raised source region is a semiconductor region that is deposited on a semiconductor region of a field effect transistor and functions as a part of a source region of the field effect transistor. A raised drain region is a semiconductor region that is deposited on a semiconductor region of a field effect transistor and functions as a part of a drain region of the field effect transistor. A raised source/drain region can be formed on a pre-existing source/drain region by a selective deposition process, which deposits a semiconductor material only on semiconductor surfaces and does not deposit any semiconductor material on a dielectric surface.

In some field effect transistors, the doping profile near the channel region can be controlled by diffusion of dopants from raised source and drain regions. A doping profile refers to the three-dimensional distribution of p-type dopants and n-type dopants in the channel and in the vicinity of the channel that includes at least the two p-n junctions between the body of the field effect transistor and each of the source region (including the raised source region) and the drain region (including the raised drain region) of the field effect transistor.

The doping profile affects various parameters of the field effect transistors, including, but not limited to, the on-current, the off-current, the threshold voltage, and the sub-threshold voltage slope. Modification of the doping profile can improve performance of field effect transistors by improving some performance parameters with, or without, a trade-off (degradation of some other performance parameters). However, in integration schemes that employ thermal dopant diffusion from raised source and drain regions as the mechanism for introducing dopants into source and drain regions, the dopant profile is a function of the geometry and diffusion parameters.

SUMMARY

Carbon-doped semiconductor material portions are formed on a subset of surfaces of underlying semiconductor surfaces contiguously connected to a channel of a field effect transistor. Carbon-doped semiconductor material portions can be formed by selective epitaxy of a carbon-containing semiconductor material layer or by shallow implantation of carbon atoms into surface portions of the underlying semiconductor surfaces. The carbon-doped semiconductor material portions can be deposited as layers and subsequently patterned by etching, or can be formed after formation of disposable masking spacers. Raised source and drain regions are formed on the carbon-doped semiconductor material portions and on physically exposed surfaces of the underlying semiconductor surfaces. The carbon-doped semiconductor material portions locally retard dopant diffusion from the raised source and drain regions into the underlying semiconductor material regions, thereby enabling local tailoring of the dopant profile, and alteration of device parameters for the field effect transistor.

According to an aspect of the present disclosure, a semiconductor structure including a field effect transistor (FET) is provided. The semiconductor structure includes an underlying source/drain region, a carbon-doped semiconductor material portion located on a surface of the underlying source/drain region, and a raised source/drain region in contact with a surface of the carbon-doped semiconductor material portion and in contact with a surface of the underlying source/drain region.

According to another aspect of the present disclosure, a method of manufacturing a semiconductor structure is provided. A semiconductor material portion laterally extending from a first sidewall surface to a second sidewall surface is provided on a substrate. A stack including a gate dielectric and a gate electrode is formed on the semiconductor material portion. A carbon-doped semiconductor material portion is formed on a first surface of the semiconductor material portion. At least one raised source/drain region is formed directly on a surface of the carbon-doped semiconductor material portion and a second surface of the semiconductor material portion. A drive-in anneal can be performed to form at least one underlying source/drain region, which are sub-portions of the semiconductor material portion doped with dopants of opposite conductivity type than the original conductivity type of the semiconductor material portion. The carbon-doped semiconductor material portion retards the dopant diffusion, thereby enabling tailoring of the doping profile within the semiconductor material portion.

DETAILED DESCRIPTION

Figure 1:
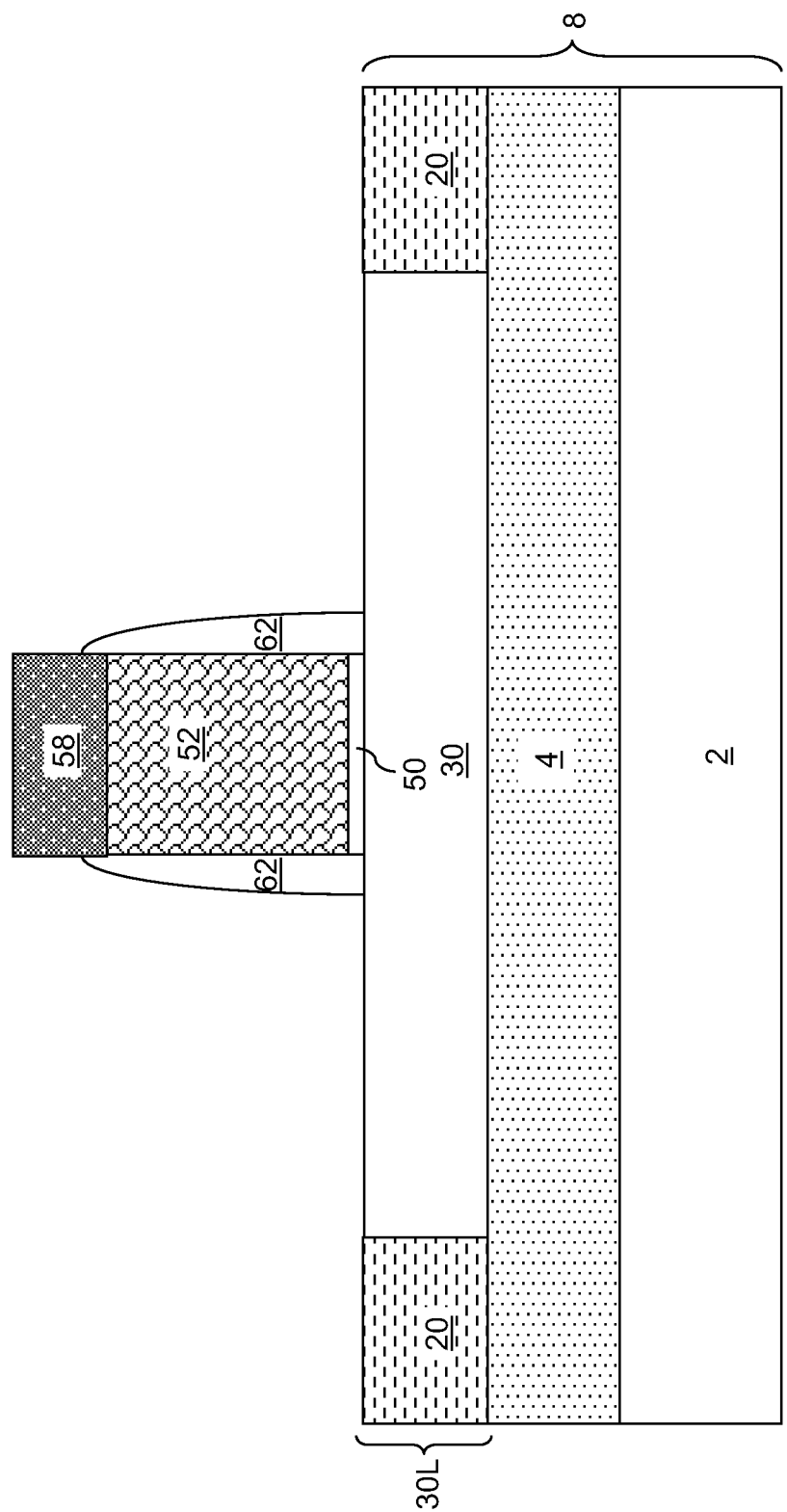
FIG. 1 is a vertical cross-sectional view of a first exemplary semiconductor structure after formation of a gate stack structure and a gate spacer according to a first embodiment of the present disclosure.

As stated above, the present disclosure relates to transistors having a doping profile controlled by carbon-doped semiconductor material portions, and methods of manufacturing the same, which are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes a substrate 8 and gate stacks formed thereupon. The substrate 8 can be a semiconductor-on-insulator (SOI) substrate or a bulk semiconductor substrate. For example, the substrate 8 can include a stack, from bottom to top, of a handle substrate 2, a buried insulator layer 4, and a top semiconductor layer 30L. The top semiconductor layer 30L can include a single crystalline semiconductor material such as single crystalline silicon. In one embodiment, the top semiconductor layer 30L can be an extremely thin semiconductor-on-insulator (ETSOI) layer including a single crystalline semiconductor material and having a thickness from 2 nm to 30 nm, although lesser and greater thicknesses can also be employed.

Shallow trench isolation structures 20 including a dielectric material can be formed in the substrate 8 to provide electrical isolation between neighboring semiconductor devices to be formed. For example, the shallow trench isolation structures 20 can be formed within the top semiconductor layer 30L.

The remaining portions of the top semiconductor material layer 30L include a semiconductor material portion 30. The semiconductor material of the semiconductor material portion 30 is herein referred to as a first semiconductor material, which can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the semiconductor material portion 30 is single crystalline. The semiconductor material portion 30 laterally extends from a first sidewall surface (which coincides with a sidewall of the shallow trench isolation structures 30) to a second sidewall surface (which coincides with another sidewall of the shallow trench isolation structure 30). The first sidewall surface and the second sidewall surface can be substantially parallel to each other.

In one embodiment, the entirety of the semiconductor material can be doped with electrical dopants of the same conductivity type, which can be p-type or n-type. The conductivity type of the semiconductor material within the semiconductor material portion 30 is herein referred to as a first conductivity type. In one embodiment, the entirety of the semiconductor material portion 30 can have the first conductivity type doping at a same dopant concentration.

Gate stack layers can be deposited on the top surface of the substrate 8. The gate stack layers can include a stack, from bottom to top, of a gate dielectric layer, a gate conductor layer, and optionally, a gate cap dielectric layer. In one embodiment, the gate stack layers may be "blanket" layers, i.e., unpatterned planar layers, each having a uniform thickness throughout. Gate stacks are formed by patterning the gate stack layers. For example, the gate stack layers can be patterned by an anisotropic etch process employing a patterned photoresist (not shown) as a masking layer to form a gate stack including a gate dielectric 50, a gate electrode 52, and optionally, a gate cap dielectric 58.

The gate dielectric layer, and consequently the gate dielectric 50, can include a dielectric material, which can be silicon oxide, silicon nitride, silicon oxynitride, or a stack thereof. Alternately or additionally, the gate dielectric layer, and consequently the gate dielectric 50, can include a high dielectric constant (high-k) material layer having a dielectric constant greater than 3.9. In one embodiment, the gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, although lesser and greater thicknesses can also be employed.

The gate conductor layer can be a single layer or a plurality of layers. Each component layer in the gate conductor layer, and consequently, each component within the gate electrode 52, can include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer can be from 20 nm to 200 nm, although lesser and greater thicknesses can also be employed.

If a gate cap dielectric layer is formed, the gate cap dielectric layer, and consequently, the gate cap dielectric 58 derived therefrom, can include a dielectric material such as silicon nitride, silicon oxide, organosilicate glass (OSG), a high dielectric constant (high-k) material layer that can be employed for the gate dielectric layer, or a combination thereof. The gate cap dielectric layer can be deposited, for example, by chemical vapor deposition or by any other deposition method known in the art. The thickness of the gate cap dielectric layer, if present, can be from 10 nm to 200 nm, and typically from 20 nm to 100 nm, although lesser and greater thicknesses can also be employed.

A gate spacer 62 can be subsequently formed on the sidewalls of the gate stack (50, 52, 58). In one embodiment, the gate spacer 62 can be formed by depositing a conformal dielectric material layer and anisotropically etching the horizontal portions of the conformal dielectric material layer. The remaining vertical portions of the conformal dielectric material layer constitute the gate spacer 62. Alternately or additionally, the gate spacer 62 can be formed by conversion of surface portions of the gate electrode 52 into a dielectric material such as silicon oxide, silicon nitride, or silicon oxynitride.

Figure 2:
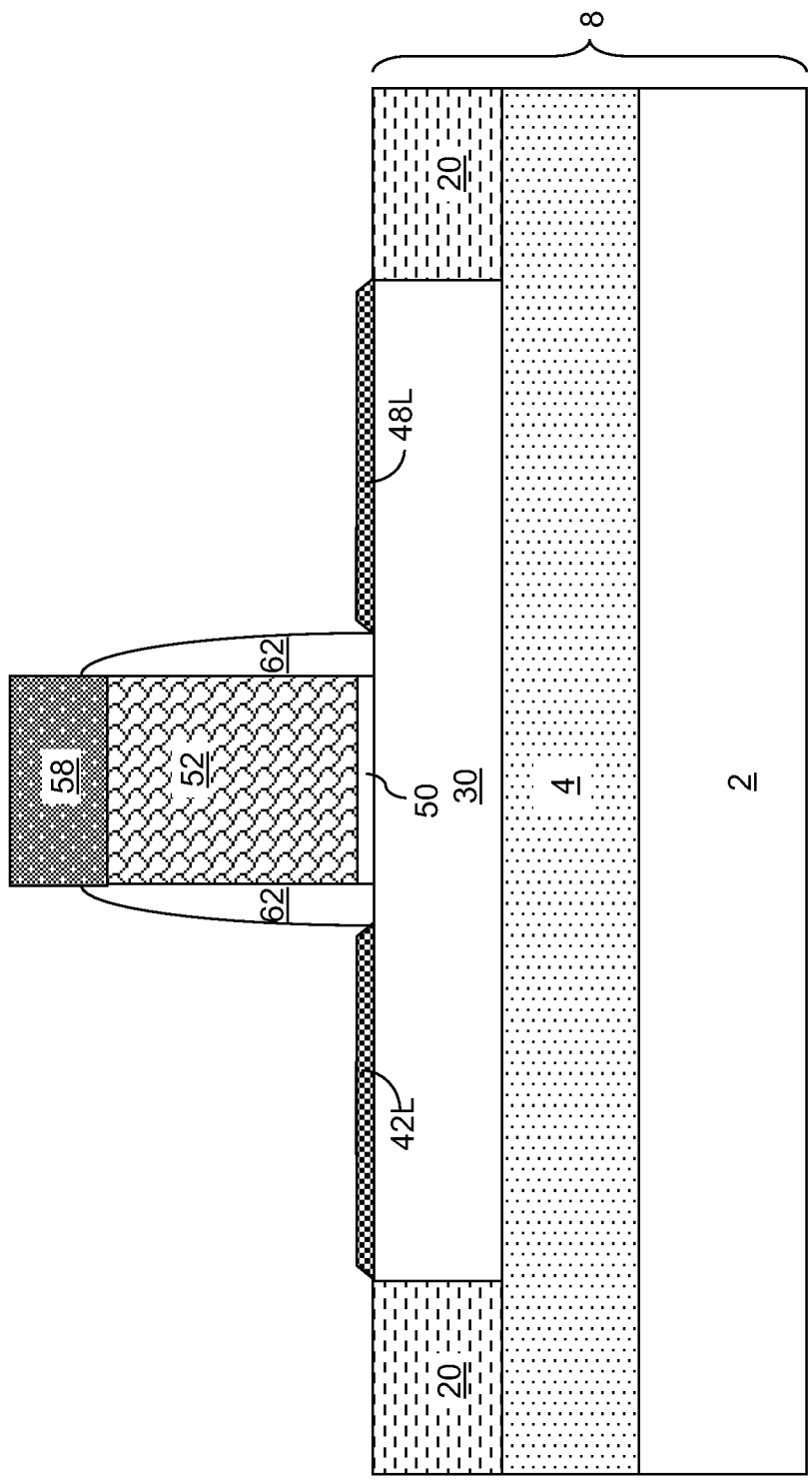
FIG. 2 is a vertical cross-sectional view of the first exemplary semiconductor structure after formation of carbon-doped semiconductor material layers by selective epitaxy according to the first embodiment of the present disclosure.

Referring to FIG. 2, carbon-doped semiconductor material layers are formed on the physically exposed surfaces of the semiconductor material portion 30 by selective deposition. In one embodiment, the carbon doped semiconductor material layers can include a source-side carbon-doped semiconductor material layer 42L and a drain-side carbon-doped semiconductor material layer 48L. In one embodiment, the selective deposition can be effected by selective epitaxy. In selective epitaxy, the first exemplary semiconductor structure is placed in a reactor, and reactant gases and an etchant gas are simultaneously or alternately flowed into the reactor. A carbon-doped semiconductor material is deposited directly on the entirety of physically exposed surfaces of the semiconductor material portion 30 during the selective epitaxy.

The reactant gases include at least one semiconductor precursor gas and a carbon precursor gas. The at least one semiconductor precursor gas can include, for example, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. At least one semiconductor precursor gas can be a single semiconductor precursor gas or a plurality of semiconductor precursor gases. The carbon precursor gas can include, for example, at least one of $CH_4$, $C_2H_2$, $C_2H_4$, $C_2H_6$, $C_3H_4$, $C_3H_6$, $C_3H_8$, and any other carbon precursor gas known in the art. The etchant gas can include, for example, hydrogen chloride gas. Optionally, a carrier gas such as $H_2$, $N_2$, Ar, and/or He can be flowed into the reactor chamber to provide a laminar flow around the physically exposed surfaces of the semiconductor material portion 30. The temperature of the reactor during the selective epitaxy process can be from 500° C. to 1,100° C., although lesser and greater temperatures can also be employed. The pressure within the reactor can be from 1 mTorr to 120 Torr, although lesser and greater pressures can also be employed. The thickness of the carbon-doped semiconductor material portions 48L can be from 1 nm to 3 nm, although lesser and greater thicknesses can also be employed.

The carbon-doped semiconductor material layers (42L, 48L) include an epitaxial alloy of a semiconductor material and carbon. The semiconductor material in the epitaxial alloy can be silicon, germanium, and/or any compound semiconductor material derived from the at least one semiconductor precursor gas. In one embodiment, facets can be formed on the carbon-doped semiconductor material layers (42L, 48L), which can be crystallographic surfaces having a local minimum at surface energy.

Figure 3:
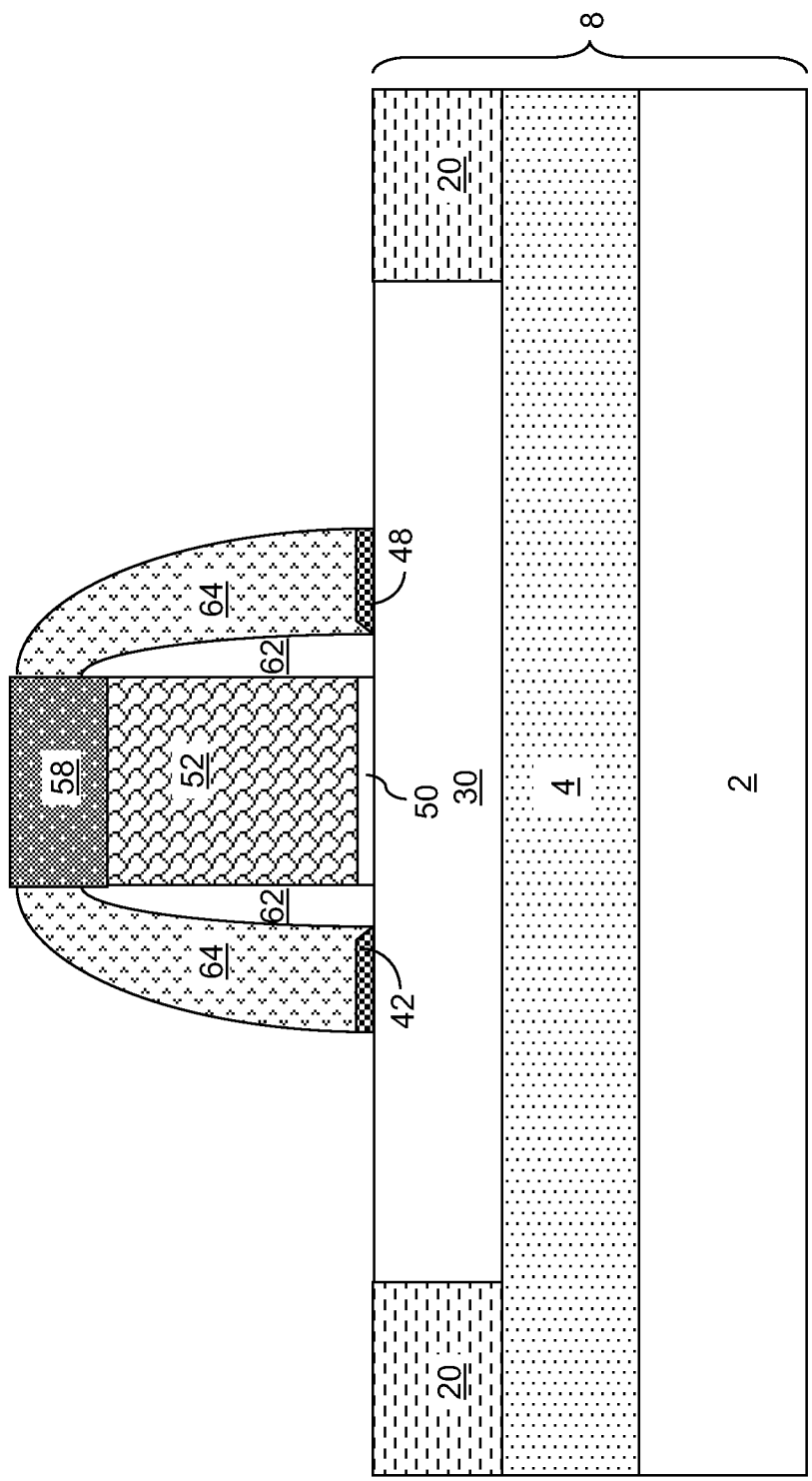
FIG. 3 is a vertical cross-sectional view of the first exemplary semiconductor structure after formation of a disposable gate spacer and removal of physically exposed portions of the carbon-doped semiconductor material layers according to the first embodiment of the present disclosure.

Referring to FIG. 3, a disposable gate spacer 64 is formed on sidewalls of the gate spacer 62, for example, by conformal deposition of a disposable material and removal of horizontal portions of the deposited disposable material. The disposable gate spacer 64 can include a dielectric material such as silicon oxide, silicon nitride, silicon oxynitride, organosilicate glass, or combinations thereof. In one embodiment, the disposable gate spacer 64 includes a dielectric material different from the dielectric material of the gate spacer 62 so that the disposable gate spacer 64 can be subsequently removed selective to the gate spacer 62.

A first portion of each of the carbon-doped semiconductor material layers (42L, 48L) is covered by the disposable gate spacer 64. A second portion of each of the carbon-doped semiconductor material layers (42L, 48L) is not covered by the disposable gate spacer 64. The first portions of the carbon-doped semiconductor material layers (42L, 48L) are more proximal to the gate stack (50, 52, 58) than the second portions of the carbon-doped semiconductor material layer 48L. The second portions of the carbon-doped semiconductor material layers (42L, 48L) are complementary portions of the first portions of the carbon-doped semiconductor material layers (42L, 48L).

The second portions of the carbon-doped semiconductor material layers (42L, 48L) are etched employing the disposable gate spacer 64 as an etch mask. The etch can be an anisotropic etch such as a reactive ion etch, or an isotropic etch such as a wet etch. The first portions of the carbon-doped semiconductor material layers (42L, 48L) remain after the etch. The first portion of the source-side carbon-doped semiconductor material layer 42L is herein referred to as a source-side carbon-doped semiconductor material portion 42, and the first portion of the drain-side carbon-doped semiconductor material layer 48L is herein referred to as a drain-side carbon-doped semiconductor material portion 48. The surfaces of the semiconductor material portion 30 that contact the carbon-doped semiconductor material portions (42, 48) are herein referred to as first surfaces. The surfaces of the semiconductor material portion 30 that become physically exposed after the etch, i.e., after the second portions of the carbon-doped semiconductor material layers (42L, 48L), are herein referred to as second surfaces.

Figure 4:
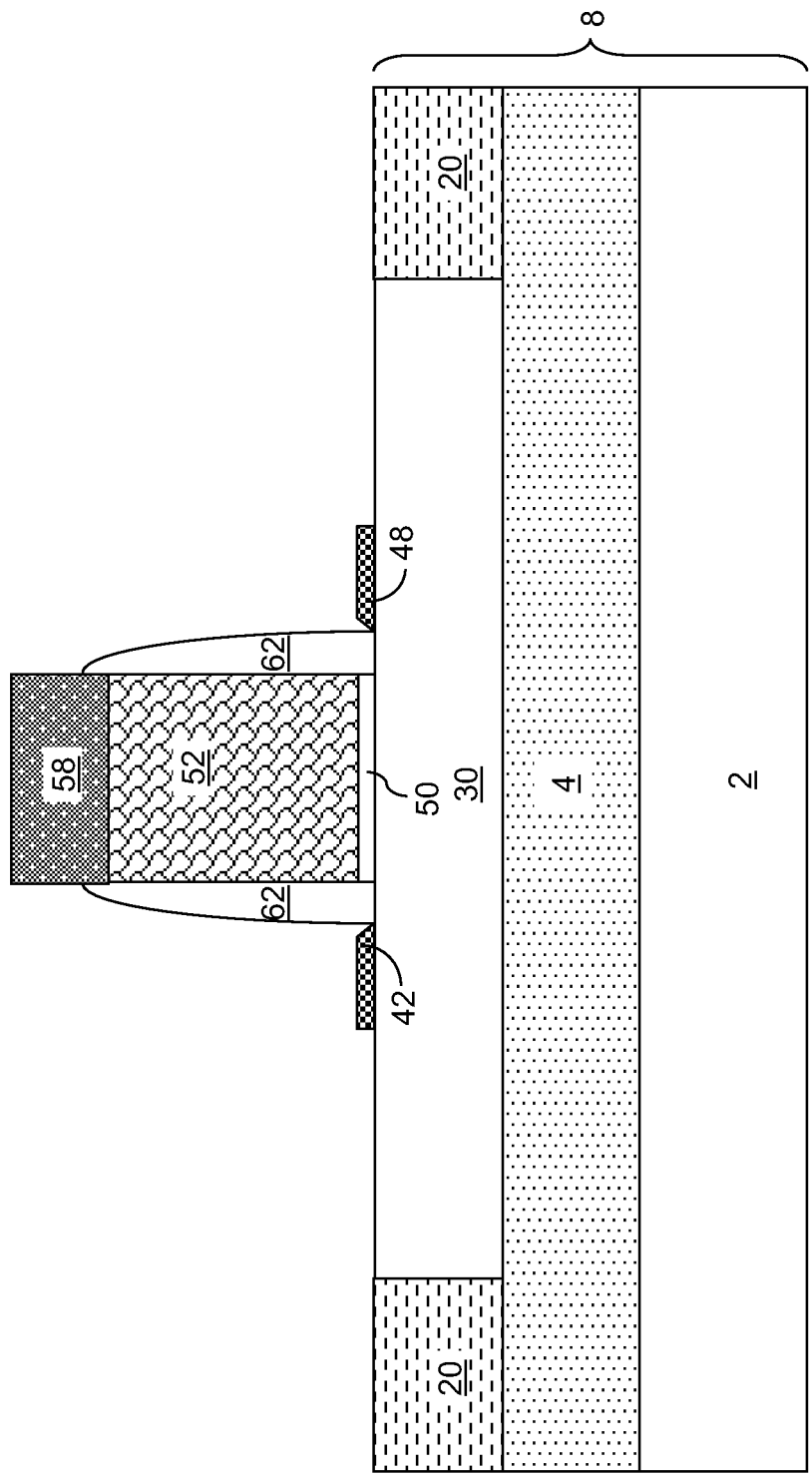
FIG. 4 is a vertical cross-sectional view of the first exemplary semiconductor structure after removal of the disposable gate spacer according to the first embodiment of the present disclosure.

Referring to FIG. 4, the disposable gate spacer 64 is removed selective to the carbon-doped semiconductor material portions (42, 48) and the gate spacer 62, for example, by an etch, which can be an isotropic etch such as a wet etch.

Figure 5:
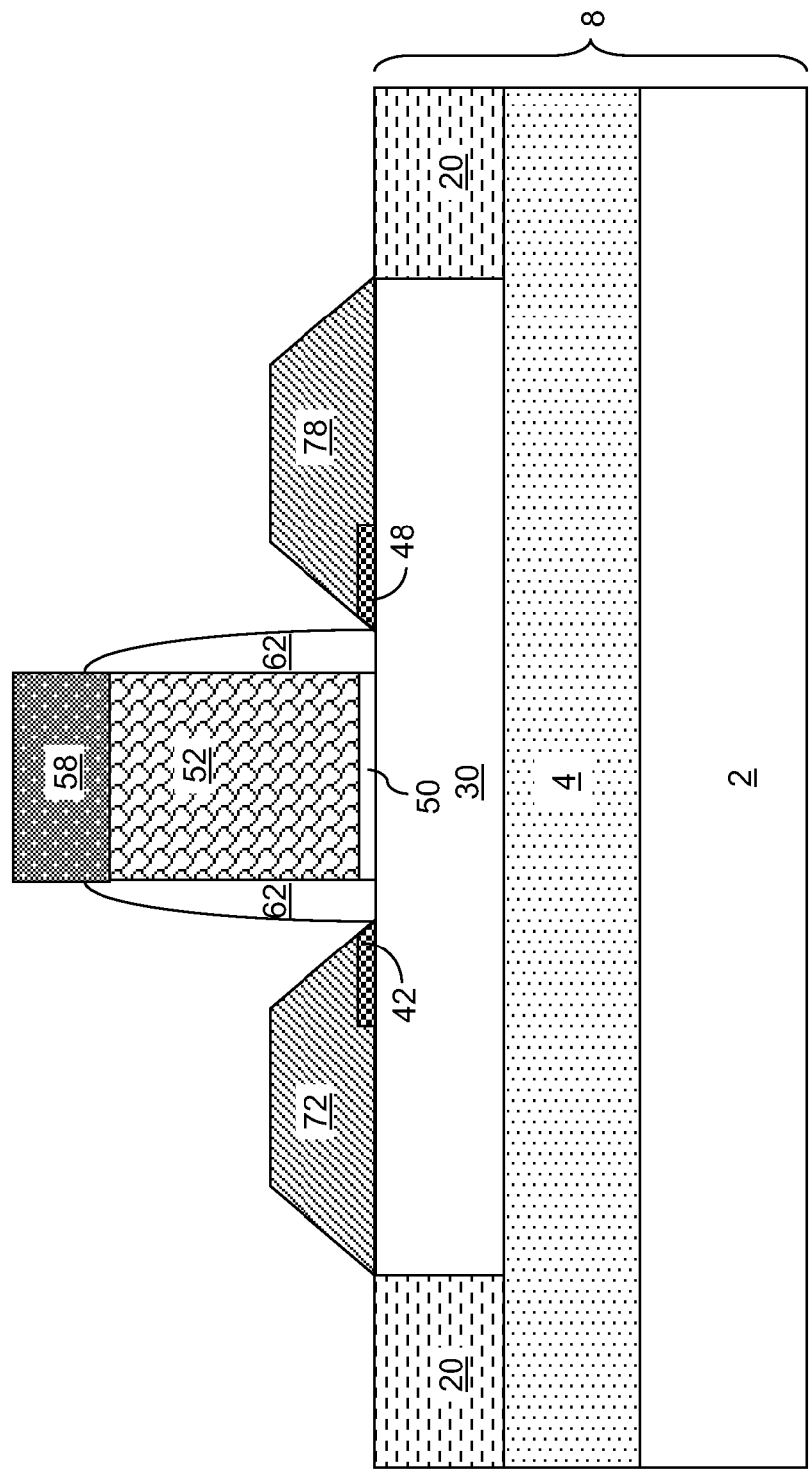
FIG. 5 is a vertical cross-sectional view of the first exemplary semiconductor structure after formation of raised source/drain regions according to the first embodiment of the present disclosure.

Referring to FIG. 5, raised source/drain regions are formed, for example, by selective epitaxy. As used herein a "raised source/drain region" is a raised source region or a raised drain region. As used herein, a "raised source region" is a portion of a source region that is located above the plane of an interface between a channel and a gate dielectric of a field effect transistor. As used herein, a "raised drain region" is a portion of a drain region that is located above the plane of an interface between a channel and a gate dielectric of a field effect transistor.

The raised source/drain regions can include a raised source region 72 and a raised drain region 78. The raised source region 72 can be formed directly on the top surface and a sidewall surface of the source side carbon-doped semiconductor material portion 42 and on the second surface of the semiconductor material portion 30 located on the source side of the gate stack (50, 52, 58), i.e., on the second surface of the semiconductor material portion 30 that is located on the same side as the source-side carbon-doped semiconductor material portion 42 relative to the gate stack (50, 52, 58). The raised drain region 78 can be formed directly on the top surface and a sidewall surface of the drain side carbon-doped semiconductor material portion 48 and on the second surface of the semiconductor material portion 30 located on the drain side of the gate stack (50, 52, 58), i.e., on the second surface of the semiconductor material portion 30 that is located on the same side as the drain-side carbon-doped semiconductor material portion 48 relative to the gate stack (50, 52, 58).

The semiconductor material of the raised source/drain regions (72, 74) is deposited selectively only on semiconductor surfaces, and is not deposited on dielectric surfaces. In one embodiment, the semiconductor material can be, for example, single crystalline silicon, single crystalline germanium, a single crystalline silicon-germanium alloy, or a single crystalline compound semiconductor material. In another embodiment, the semiconductor material can be a polycrystalline elemental semiconductor material, a polycrystalline alloy of at least two of silicon, germanium, and carbon, a polycrystalline compound semiconductor material, or an amorphous semiconductor material.

During the selective deposition, the semiconductor material is deposited only on exposed semiconductor surfaces while the semiconductor material is not deposited on dielectric surfaces. The selective deposition can employ simultaneous or alternating steps of deposition and etch of the semiconductor material. The deposition is effected by flowing a reactant gas including a precursor for the semiconductor material in a processing chamber in which the first exemplary semiconductor structure is placed for processing. Exemplary precursors to the semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. The etch step, which can be performed simultaneously with or in alternation with the deposition step, is effected by flowing an etchant gas in the processing chamber. Exemplary etchants include, but are not limited to, HCl. The thickness of the raised source region 72 and the raised drain region 78, as measured between a topmost surface and a bottommost surface, can be, for example, from 2 nm to 100 nm, although lesser and greater thicknesses can also be employed.

Each of the raised source/drain regions (72, 78) can be formed with in-situ doping that is of the opposite conductivity type as the conductivity type of the semiconductor material portion 30. The conductivity type of the raised source/drain regions (72, 78) is herein referred to as a second conductivity type, which is the opposite type of the first conductivity type (i.e., the conductivity type of the semiconductor material portion 30). If the first conductivity type is p-type, the second conductivity type is n-type, and vice versa. The dopants in the raised source/drain regions (72, 78) are electrical dopants, i.e., p-type dopants such as B, Ga, and In, or n-type dopants such as P, As, or Sb. The dopant concentration in the raised source/drain regions (72, 78) can be, for example, from $1.0 \times 10^{20}/cm^3$ to $3.0 \times 10^{21}/cm^3$, although lesser and greater dopant concentrations can also be employed.

In one embodiment, each of the raised source/drain regions (72, 78) can be epitaxially aligned to the single crystalline structures of the semiconductor material portion 30 and the carbon-doped semiconductor material portions (42, 48).

In one embodiment, the bottom surfaces of the raised source/drain regions (72, 78) and the bottom surfaces of the carbon-doped semiconductor material portions (42, 48) can be coplanar with a bottom surface of the gate dielectric 50.

The interfaces between the semiconductor material portion 30 and the raised source/drain regions (72, 78) are herein referred to as first interfaces. The first interfaces coincide with the second surfaces discussed above. The interfaces between the semiconductor material portion and the carbon-doped semiconductor material portions (42, 48) are herein referred to as second interfaces. The second interfaces coincide with the first surfaces discussed above. The first interfaces are spaced from the gate electrode 52 of a field effect transistor by a greater lateral distance than the second interfaces.

Figure 6:
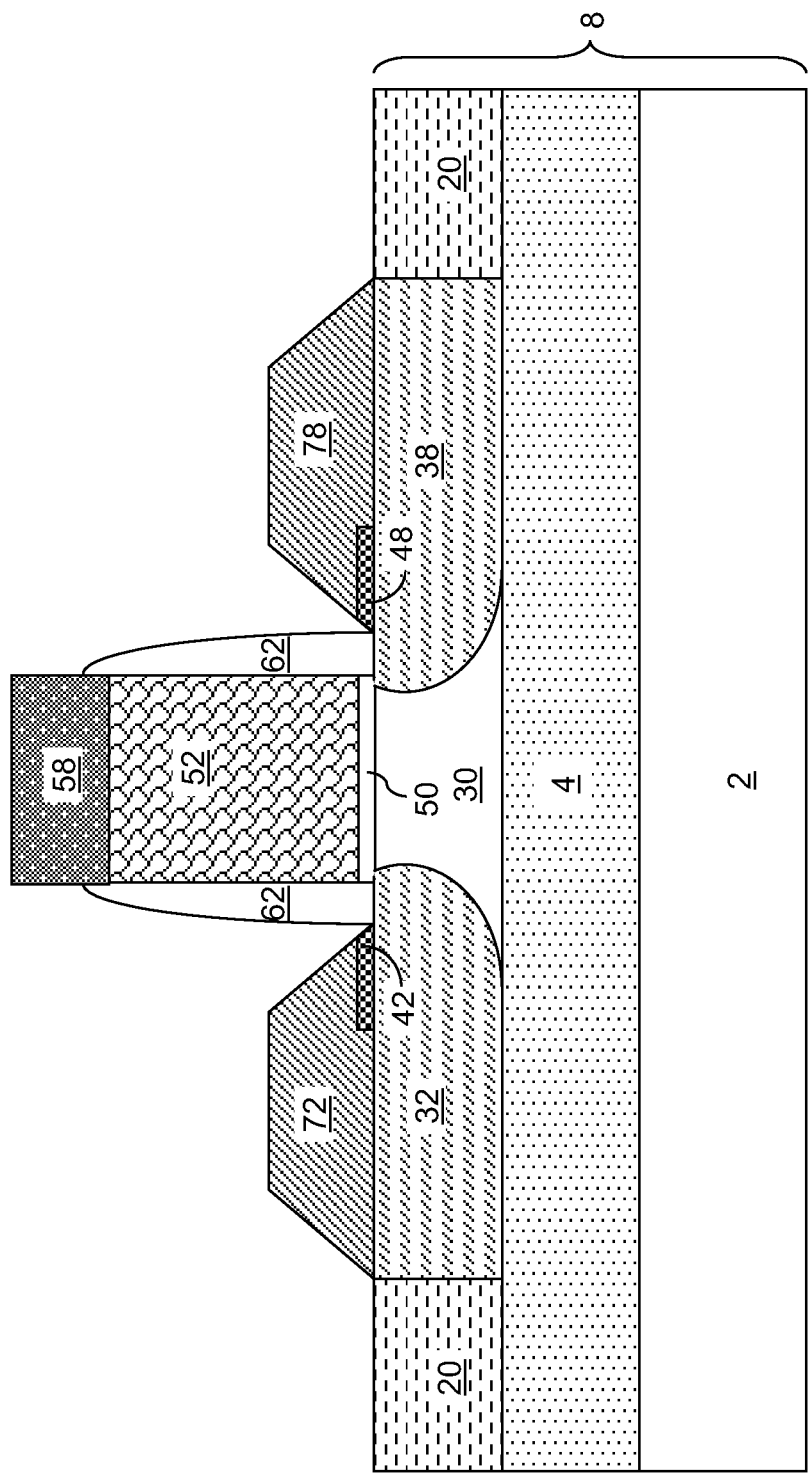
FIG. 6 is a vertical cross-sectional view of the first exemplary semiconductor structure after formation of underlying source/drain regions by an anneal according to the first embodiment of the present disclosure.

Referring to FIG. 6, an anneal is performed at an elevated temperature to outdiffuse the dopants of the second conductivity type from the raised source/drain regions (72,78) into the semiconductor material portion 30. Electrical dopants within the raised source/drain regions (72, 78) diffuse into sub-portions of the semiconductor material portion 30. A sub-portion of the semiconductor material portion 30 that is doped with the dopants of the second conductivity type from the raised source region 72 is converted into a region having a doping of the second conductivity type, which is herein referred to as an underlying source region 32. A sub-portion of the semiconductor material portion 30 that is doped with the dopants of the second conductivity type from the raised drain region 78 is converted into another region having a doping of the second conductivity type, which is herein referred to as an underlying drain region 38.

The carbon-doped semiconductor material portions (42, 48) retard the outdiffusion of the dopants of the second conductivity type from the raised source/drain regions (72, 78) into the semiconductor material portion 30. Thus, more dopants of the second conductivity type diffuse through a unit area of the first interfaces between the semiconductor material portion 30 and the raised source/drain regions (72, 78) than through a unit area of the second interfaces between the semiconductor material portion 30 and the carbon-doped semiconductor material portions (42, 48).

In one embodiment, the underlying source region 32 and the underlying drain region 38 can reach to the top surface of the buried insulator layer 20 directly underneath the first interfaces. The retardation of the diffusion of the second conductivity dopants by the carbon-doped semiconductor material portions (42, 48) causes the underlying source/drain regions (32, 38) to become shallower, i.e., to have a lesser thickness, underneath the periphery of the gate stack (50, 52, 58) than underneath the first interfaces.

The remaining portion of the semiconductor material portion 30 includes a body region of the field effect transistor. In one embodiment, the entirety of the semiconductor material portion 30 has a doping of the first conductivity type at the same dopant concentration prior to the annealing. The remaining sub-portion of the semiconductor material portion 30 has a doping of the first conductivity type. The underlying source/drain regions (32, 38) have a doping of the second conductivity type.

Two p-n junctions are formed within the semiconductor material portion 30 after the annealing. A first p-n junction is between the remaining portion of the semiconductor material portion 30 and the underlying source region 32, and a second p-n junction is between the remaining portion of the semiconductor material portion and the underlying drain region 38.

In one embodiment, the first interfaces between the underlying source/drain regions (32, 38) and the raised source/drain regions (72, 78) are spaced from the gate electrode 52 of the field effect transistor by a greater lateral distance than the second interfaces between the underlying source/drain regions (32, 38) and the carbon-doped semiconductor material portions (72, 78).

Figure 7:
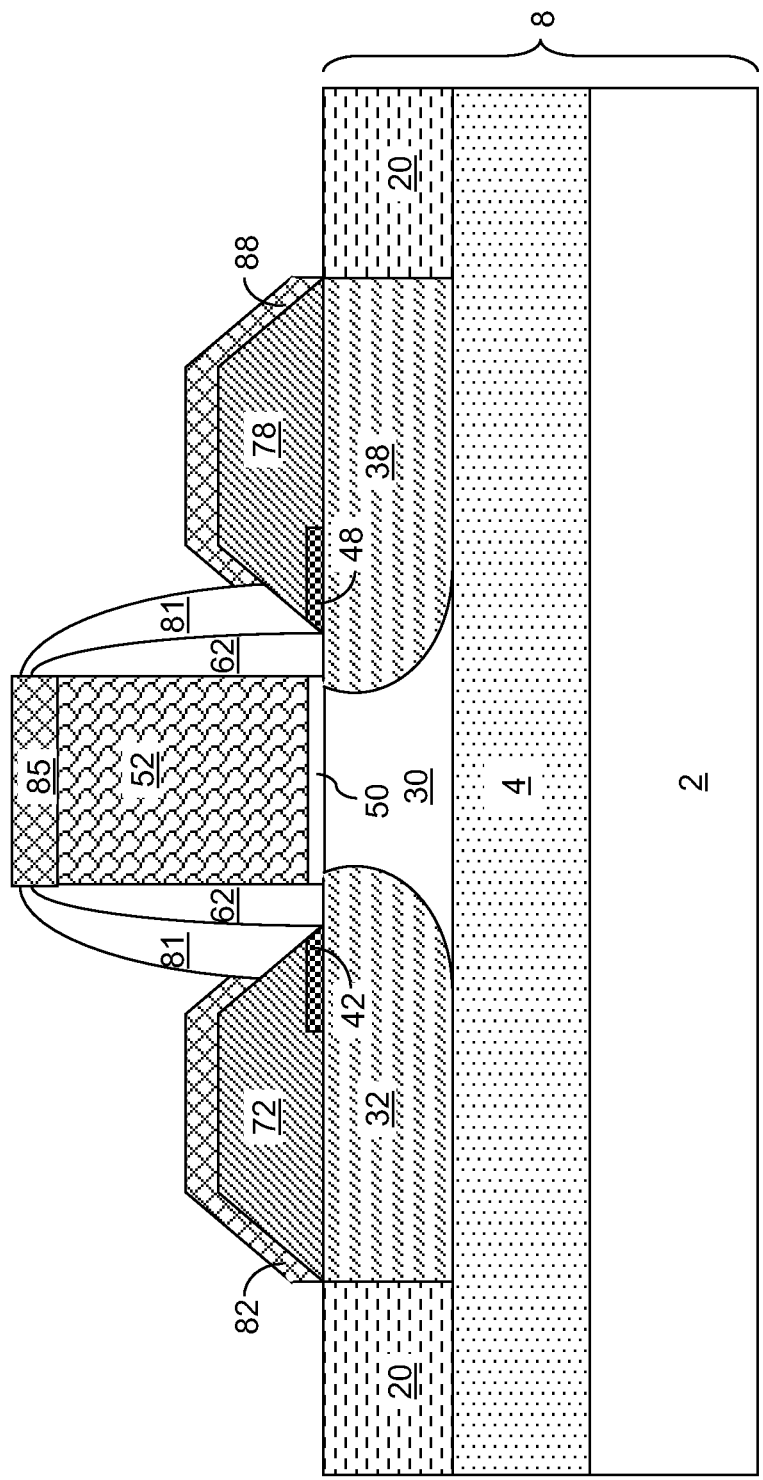
FIG. 7 is a vertical cross-sectional view of the first exemplary semiconductor structure after formation of metal semiconductor alloy portions according to the first embodiment of the present disclosure.

Referring to FIG. 7, the gate cap dielectric 58 can be removed selective to the raised source/drain regions (72, 78) and the gate spacer 62. An outer gate spacer 82 can be formed on sidewalls of the gate spacer 62. A conformal dielectric material layer can be deposited, for example, by chemical vapor deposition, and an anisotropic etch can be subsequently performed to remove horizontal portions of the conformal dielectric layer. The remaining vertical portions of the conformal dielectric layer constitute the outer gate spacer 81. Various metal semiconductor alloy portions can be formed, for example, by depositing a metal and reacting the metal with underlying semiconductor materials. Unreacted portions of the deposited metal can be removed selective to the various metal semiconductor alloy portions. The various metal semiconductor alloy portions can include, for example, a source-side metal semiconductor alloy portion 82, a drain-side metal semiconductor alloy portion 88, and a gate-side metal semiconductor alloy portion 85.

Figure 8:
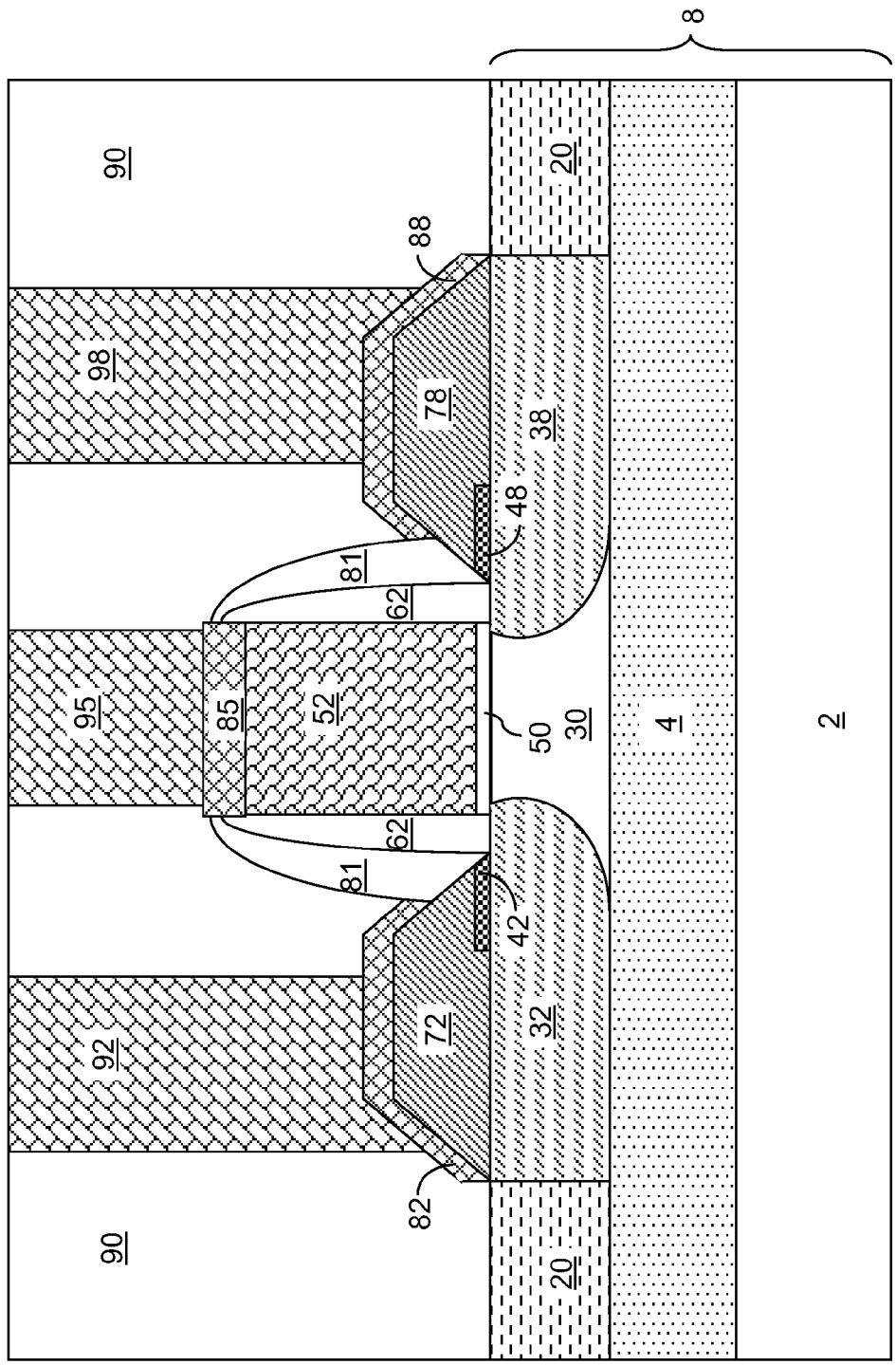
FIG. 8 is a vertical cross-sectional view of the first exemplary semiconductor structure after formation of a contact-level dielectric layer and various contact via structures according to the first embodiment of the present disclosure.

Referring to FIG. 8, a contact-level dielectric layer 90 can be deposited and planarized, for example, by chemical mechanical planarization. The contact-level dielectric layer 90 includes a dielectric material such as silicon oxide, silicon nitride, silicon oxynitride, and/or porous or non-porous organosilicate glass (OSG). Various contact via holes are formed within the contact-level dielectric layer 90, and are subsequently filled with at least one conductive material to form various contact via structures. The contact via structures can include, for example, a source-side contact via structure 92, a drain-side contact via structure 98, and a gate-side contact via structure 95.

The first exemplary semiconductor structure includes at least an underlying source/drain region (32 or 38), a carbon-doped semiconductor material portion (42 or 48) located on a surface of the underlying source/drain region (32 or 38), and a raised source/drain region (72 or 78) in contact with a surface of the carbon-doped semiconductor material portion (42 or 48) and in contact with a surface of the underlying source/drain region (32 or 38). The underlying source/drain region (32, 38) can be located within a semiconductor-on-insulator (SOI) substrate 8, and can contact the top surface of a buried insulator layer 4. A bottom surface of the carbon-doped semiconductor material portion (42 or 48) can be coplanar with a top surface of the underlying source/drain region (32, 38).

The gate spacer 62 can laterally contact the gate electrode 52 of the field effect transistor. An edge of the carbon-doped semiconductor material portion (42 or 48) can coincide with an edge of the gate spacer 52. A bottom surface of the carbon-doped semiconductor material portion (42 or 48) can be coplanar with a bottom surface of the gate spacer 62. A metal semiconductor alloy portion (82 or 88) can be in contact with the raised source/drain region (72 or 78) and the carbon-doped semiconductor material portion (82 or 88).

Figure 9:
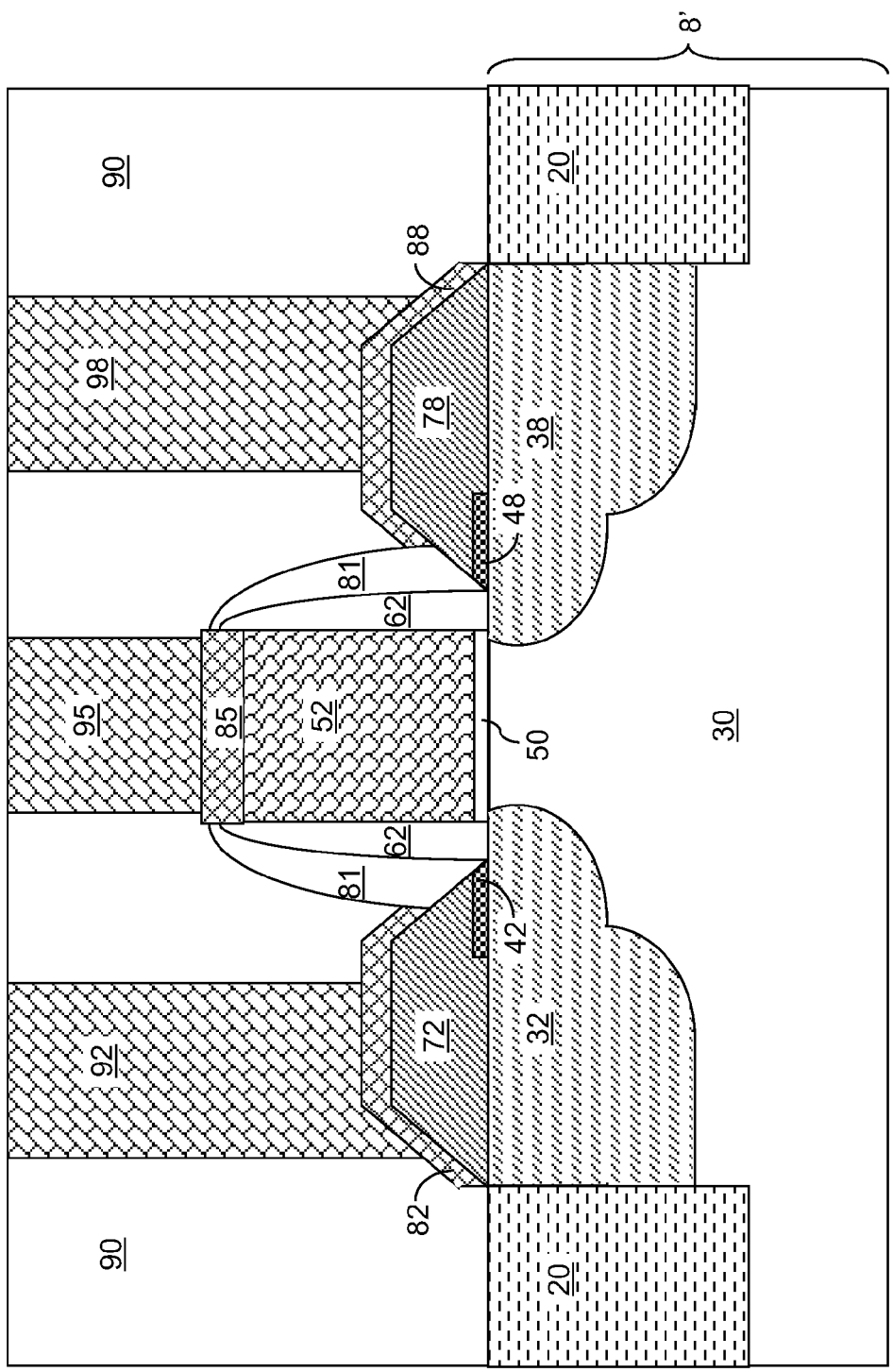
FIG. 9 is a vertical cross-sectional view of a first variation of the first exemplary semiconductor structure according to the first embodiment of the present disclosure.

Referring to FIG. 9, a first variation of the first exemplary semiconductor structure can be derived from the first exemplary semiconductor structure by replacing the SOI substrate 8 with a bulk substrate 8', which can consist of a semiconductor material layer as provided. Upon formation of shallow trench isolation structures 20 employing the processing steps of FIG. 1, a semiconductor material portion 30 laterally extending from a first sidewall surface (i.e., a first interface with the shallow trench isolation structures 20) to a second sidewall surface (i.e., a second interface with the shallow trench isolation structures 20) can be formed on the bulk substrate 8'. The processing steps of FIGS. 2-8 can be subsequently performed to provide the structure illustrated in FIG. 9. The first interfaces do not retard the diffusion of the dopants of the second conductivity type from the raised source/drain regions (72, 78) into the semiconductor material portion 30 and the carbon-doped semiconductor material regions (42, 48) retard the diffusion of the dopants of the second conductivity type during the formation of the underlying source region 32 and the underlying drain region 38. Thus, the portions of the underlying source/drain regions (32, 38) that underlie the first interfaces have a greater thickness than the portions of the underlying source/drain regions (32, 38) that underlie the carbon-doped semiconductor material portions (42, 48).

Figure 10:
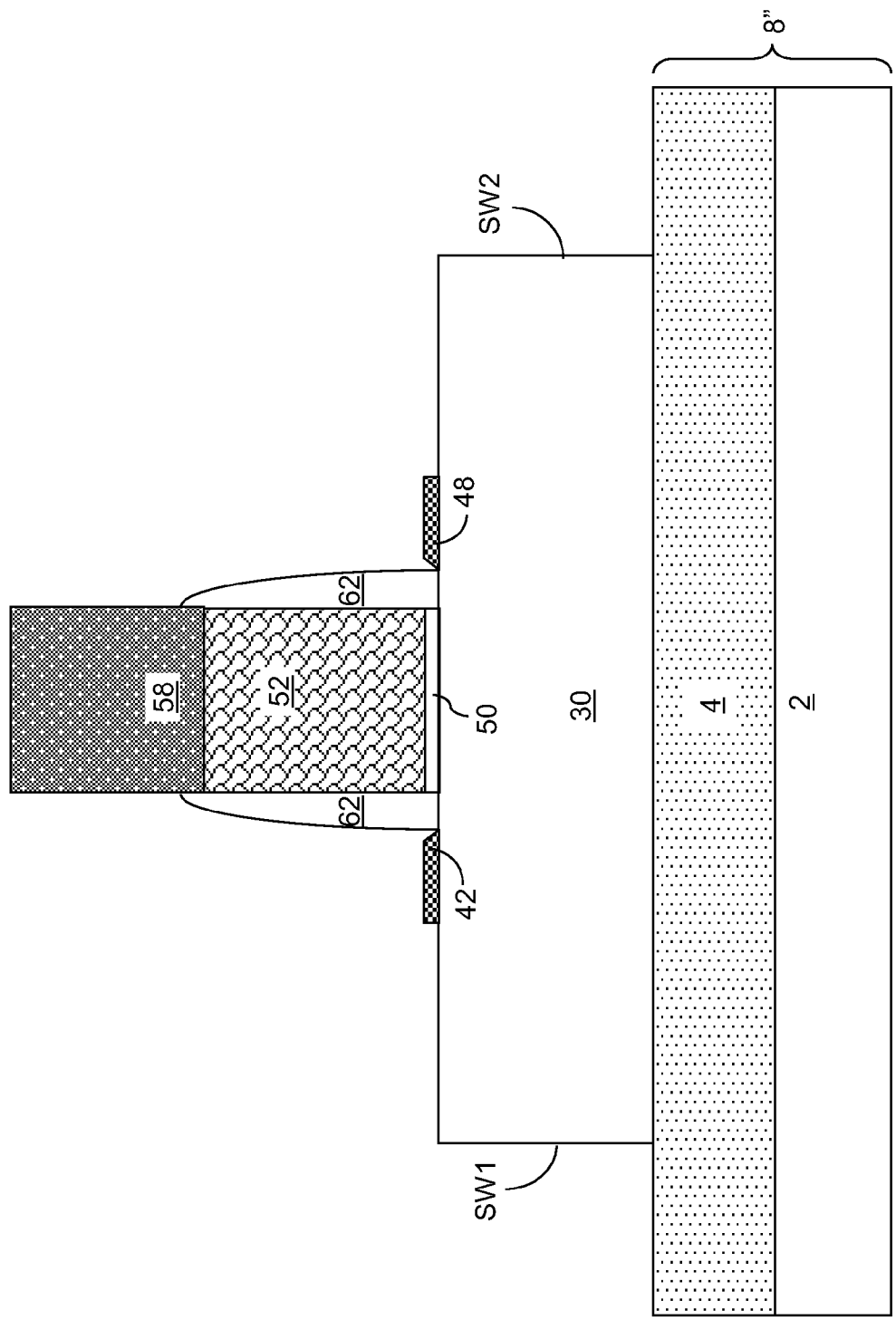
FIG. 10 is a vertical cross-sectional view of a second variation of the first exemplary semiconductor structure after removal of the disposable gate spacer according to the first embodiment of the present disclosure.

Referring to FIG. 10, a second variation of the first exemplary semiconductor structure can be derived from the first exemplary structure by not forming shallow trench isolation structures at the processing steps of FIG. 1. The semiconductor material portion 30 laterally extends from a first sidewall surface SW1 to a second sidewall surface SW2, and is located on a substrate 8", which includes a stack of the handle substrate 2 and the buried insulator layer 4. In one embodiment, the semiconductor fin can have a lateral width, i.e., a width in a direction that is parallel to the first sidewall surface SW1 and the second sidewall surface SW2, from 5 nm to 50 nm to provide full depletion during operation as a finFET.

Figure 11:
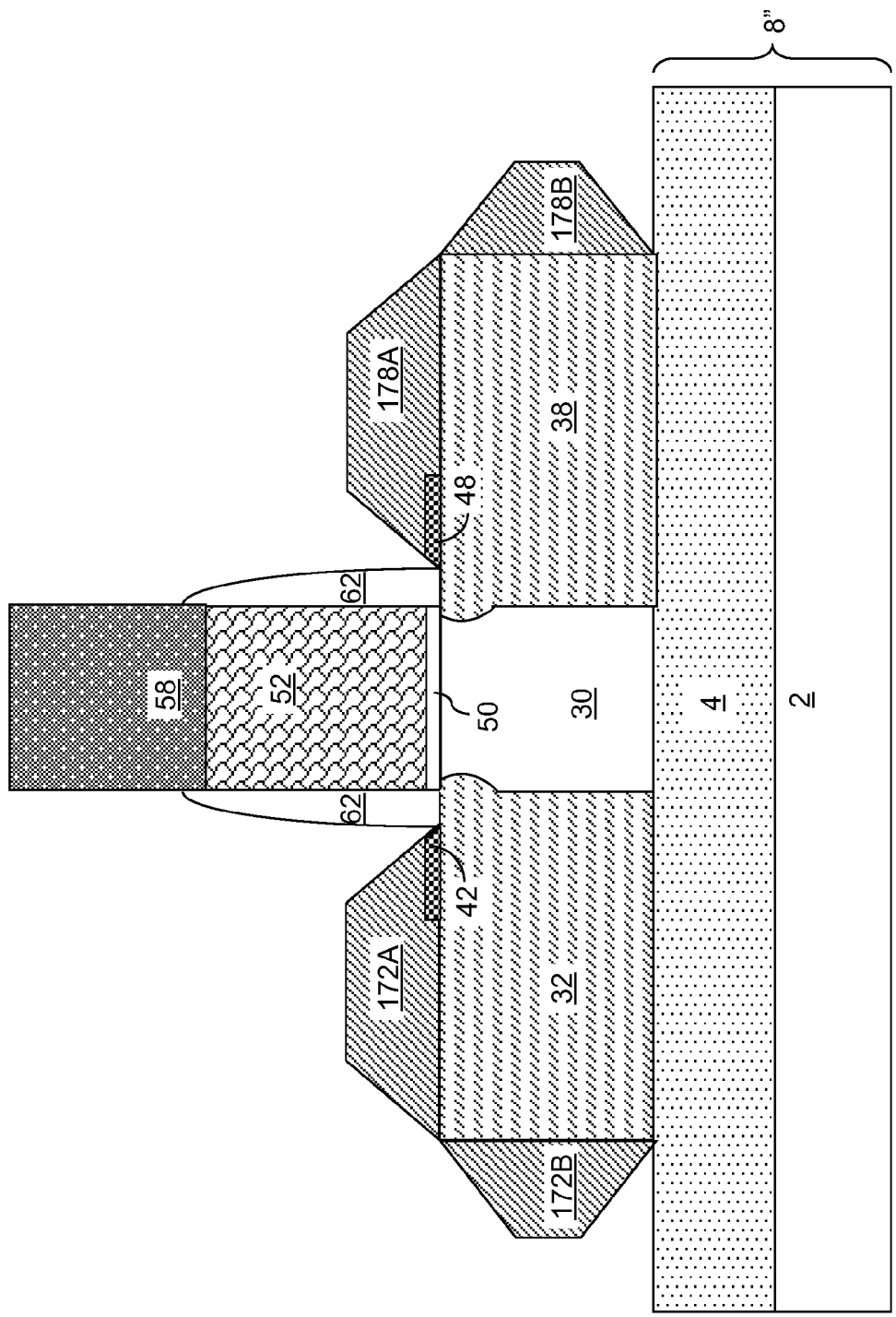
FIG. 11 is a vertical cross-sectional view of the second variation of the first exemplary semiconductor structure after formation of underlying source/drain regions by an anneal according to the first embodiment of the present disclosure.

Referring to FIG. 11, the processing steps of FIGS. 2-5 are performed. The raised source/drain regions formed by selective deposition, such as selective epitaxy process described above, can include a top raised source region 172A, an end raised source region 172B, two side raised source regions 172C (See FIG. 12A), a top raised drain region 178A, an end raised drain region 178B, and two side raised drain regions 178C (See FIG. 12A).

Subsequently, the processing steps of FIG. 6 are performed. An underlying source region 32 is formed by diffusion of dopants of the second conductivity type from the top raised source region 172A, the end raised source region 172B, and the two side raised source regions 172C into a sub-portion of semiconductor fin, i.e., the semiconductor material portion 30. Likewise, an underlying drain region 38 is formed by diffusion of dopants of the second conductivity type from the top raised drain region 178A, the end raised drain region 178B, and the two side raised drain regions 178C into another sub-portion of semiconductor fin. The remaining portion of the semiconductor material portion 30 constitutes a body region of the fin field effect transistor.

Figure 12:
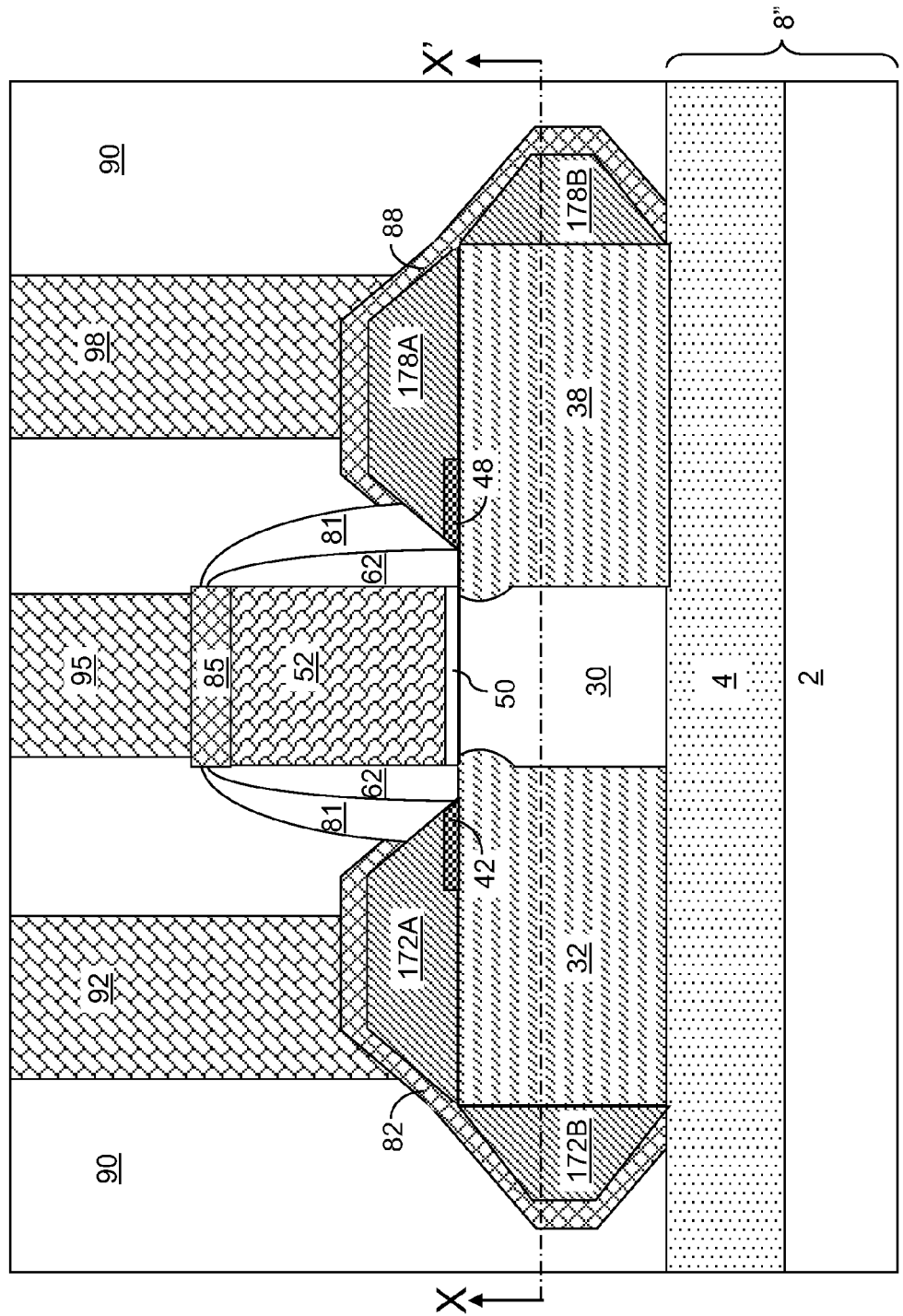
FIG. 12 is a vertical cross-sectional view of the second variation of the first exemplary semiconductor structure after formation of a contact-level dielectric layer and various contact via structures according to the first embodiment of the present disclosure.
Figure 12A:
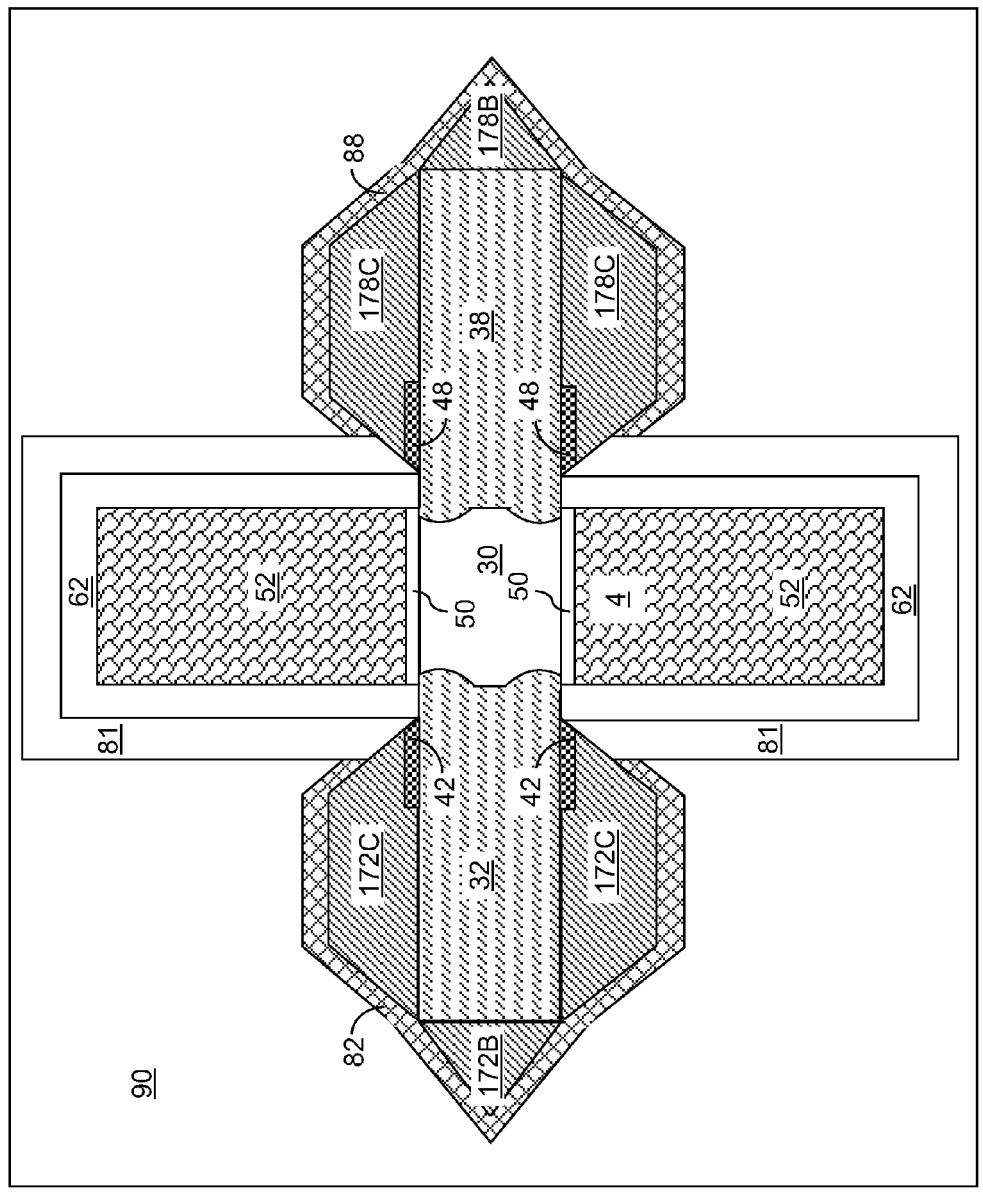
FIG. 12A is a horizontal cross-sectional view of the second variation of the first exemplary semiconductor structure of FIG. 12 along the plane X-X'.

Referring to FIGS. 12 and 12A, the processing steps of FIGS. 7-8 are performed to form a contact-level dielectric layer 90 and various contact via structures (92, 95, 98).

Figure 13:
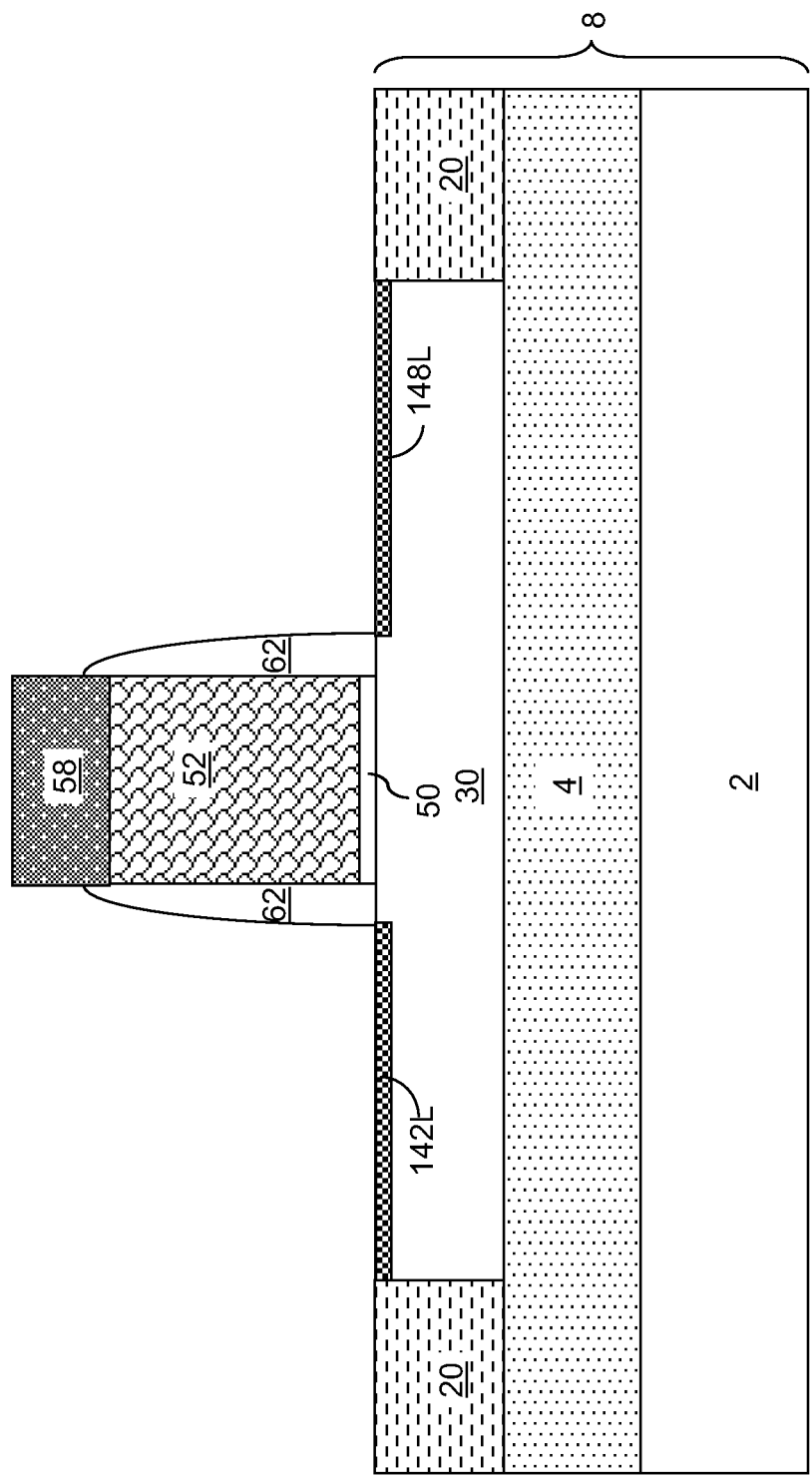
FIG. 13 is a vertical cross-sectional view of a second exemplary semiconductor structure after formation of carbon-doped semiconductor material layers by plasma doping according to the second embodiment of the present disclosure.

Referring to FIG. 13, a second exemplary semiconductor structure according to the second embodiment of the present disclosure is derived from the first exemplary semiconductor structure of FIG. 1 by forming carbon-doped semiconductor material layers by plasma doping. Specifically, the first exemplary semiconductor structure of FIG. 1 can be placed in a plasma chamber, and a plasma of at least one carbon-containing gas is generated within the plasma chamber.

The at least one carbon-containing gas can be one or more gases selected from, but is not limited to, $CH_4$, $C_2H_2$, $C_2H_4$, $C_2H_6$, $CF_4$, $CHF_3$, $CH_2F_2$, other hydrocarbon gases, other fluorocarbon gases, and other hydrofluorocarbon gases. The pressure within the plasma chamber can be from 1 mTorr to 30 mTorr, although lesser and greater pressures can also be employed. The temperature of the plasma chamber can be from 0° C. to 200° C., although lower and higher temperatures can also be employed. The kinetic energy of the ions in the plasma can be, for example, from 1.0 keV to 3.0 keV, although lesser and greater kinetic energies can also be employed. The bias voltage of a chuck in the plasma chamber can be, for example, from 200 V to 1 kV, although lesser and greater voltages can also be employed. The concentration of carbon atoms in the plasma-doped regions can be, for example, from $1.0 \times 10^{13}/cm^3$ to $1.0 \times 10^{18}/cm^3$, although lesser and greater carbon concentrations can also be employed.

The carbon-doped semiconductor material layers are formed by plasma doping of the entirety of physically exposed surfaces of the semiconductor material portion 30. The carbon-doped semiconductor material layers include a source-side carbon-doped semiconductor material portion 142L and a drain-side carbon-doped semiconductor material portion 148L. The source-side carbon-doped semiconductor material portion 142L is formed by introduction of carbon dopants into a surface sub-portion of the semiconductor material portion 30 on the source side (which is one side relative to the gate stack (50, 52, 58)), and the drain-side carbon-doped semiconductor material portion 148L is formed by introduction of carbon dopants into a surface sub-portion of the semiconductor material portion 30 on the drain side (which is the opposite side relative to the gate stack (50, 52, 58)). The thickness of the carbon-doped semiconductor material layers (142l, 148L) can be from 1 nm to 3 nm, although lesser and greater thicknesses can also be employed. Use of the plasma doping enables formation of the carbon-doped semiconductor material layers (142l, 148L) enables formation of the carbon-doped semiconductor material layers (142l, 148L) as extremely thin layers at a thickness range that is not otherwise achievable.

Figure 14:
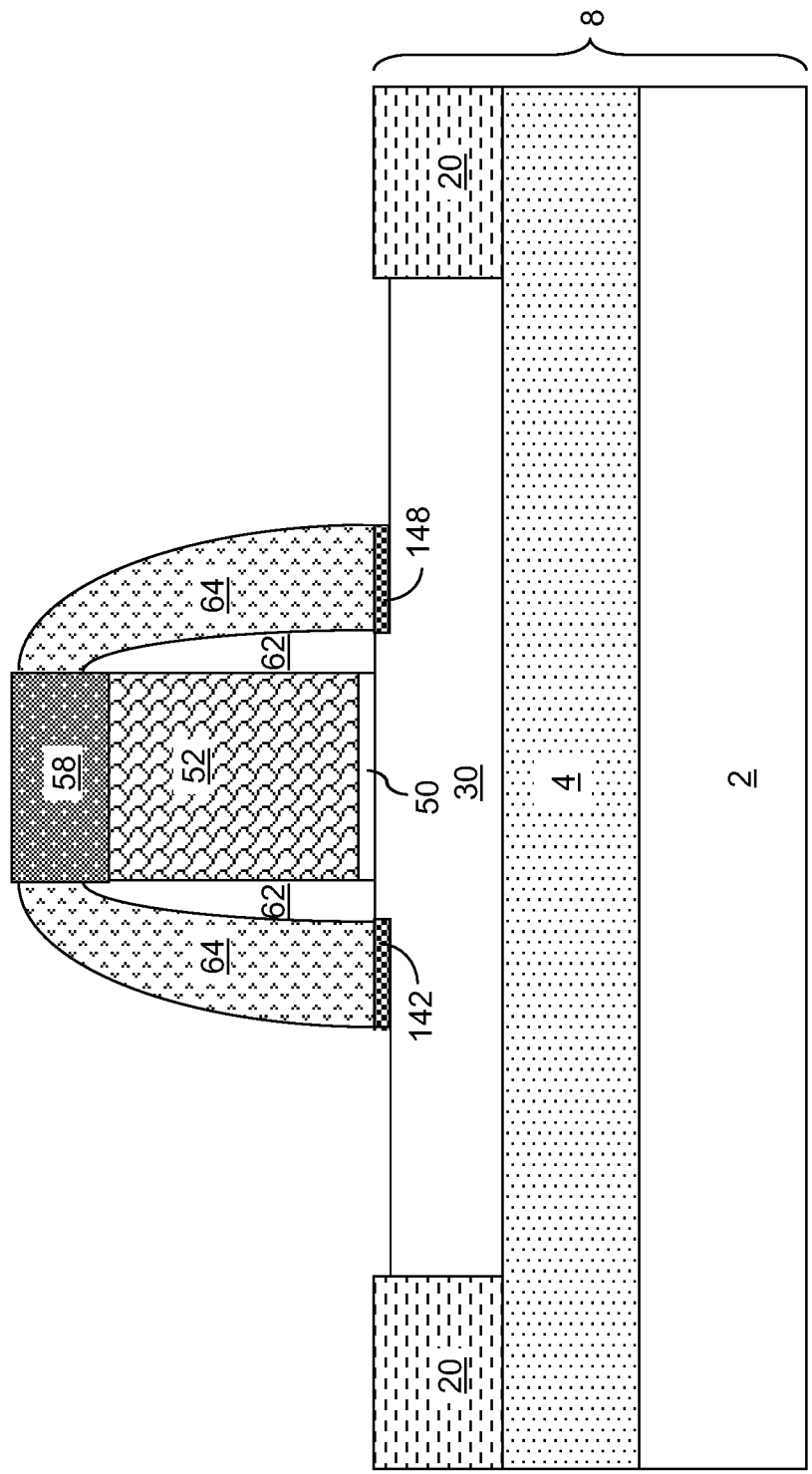
FIG. 14 is a vertical cross-sectional view of the second exemplary semiconductor structure after formation of disposable gate spacer and removal of physically exposed portions of the carbon-doped semiconductor material layers according to the second embodiment of the present disclosure.

Referring to FIG. 14, the processing steps of FIG. 3 are performed to form a disposable gate spacer 64, and to remove physically exposed portions of the carbon-doped semiconductor material layers (142L, 148L). The physically exposed portions of the carbon-doped semiconductor layers (142L, 148L) are removed employing the disposable gate spacer 64 as an etch mask. A remaining portion of the source-side carbon-doped semiconductor material layer 142L is a source-side carbon-doped semiconductor material portion 142, and a remaining portion of the drain-side carbon-doped semiconductor material layer 148L is a drain-side carbon-doped semiconductor material portion 148. First surfaces of the semiconductor material portion 30 are in physical contact with bottom surfaces of the carbon-doped semiconductor material portions (142, 148). Thus, carbon-doped semiconductor material portions (142, 148) are formed on the first surfaces of the semiconductor material portion 30. Second surfaces of the semiconductor material portion 30 are physically exposed in areas from which the carbon-doped semiconductor material layers (142L, 148L) are removed.

Figure 15:
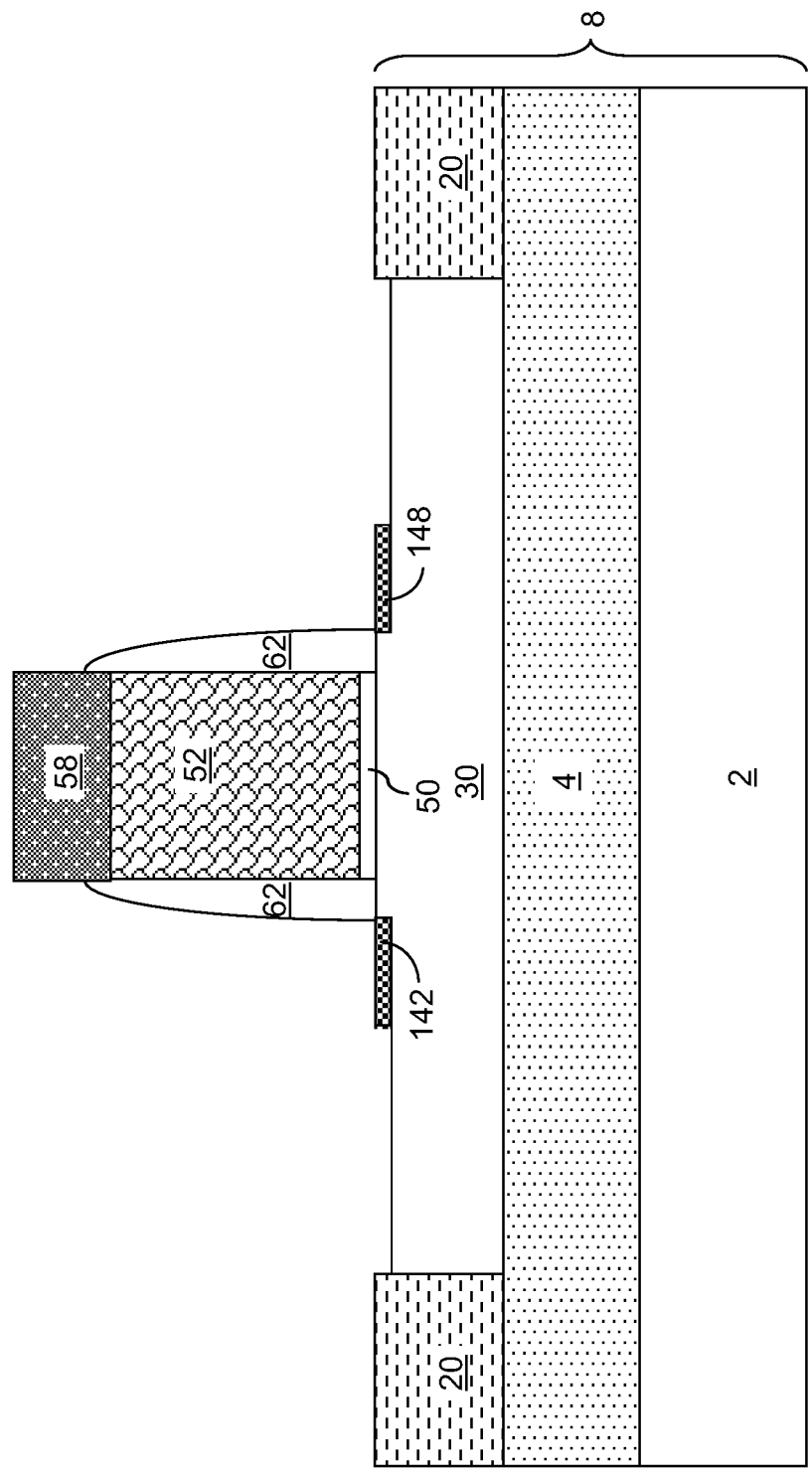
FIG. 15 is a vertical cross-sectional view of the second exemplary semiconductor structure after removal of the disposable gate spacer according to the second embodiment of the present disclosure.

Referring to FIG. 15, the disposable gate spacer 64 can be removed selective to the carbon-doped semiconductor material portions (142, 148) employing the processing steps of FIG. 4.

Figure 16:
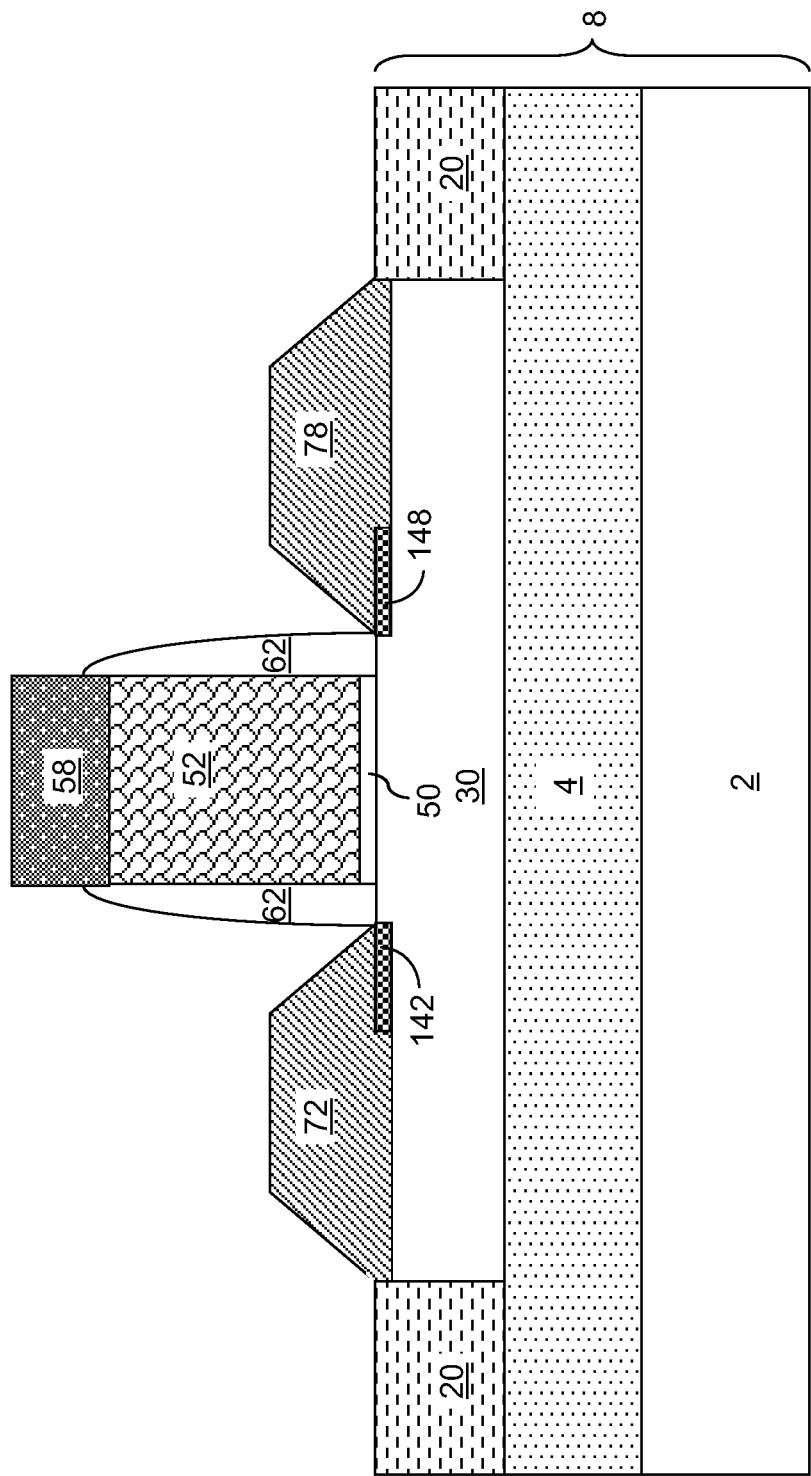
FIG. 16 is a vertical cross-sectional view of the second exemplary semiconductor structure after formation of raised source/drain regions according to the second embodiment of the present disclosure.

Referring to FIG. 16, raised source/drain regions (72, 78) are formed employing the processing steps of FIG. 5. The raised source/drain regions (72, 78) are formed directly on the surfaces of the carbon-doped semiconductor material portions (142, 148) and second surfaces of the semiconductor material portion 30. First interfaces between the semiconductor material portion 30 and the raised source/drain regions (72, 78) coincide with the second surfaces discussed above. Second interfaces between the semiconductor material portion 30 and the carbon-doped semiconductor material portions (142, 148) coincide with the first surfaces discussed above. The first interfaces are spaced from the gate electrode 52 of a field effect transistor by a greater lateral distance than the second interfaces.

Figure 17:
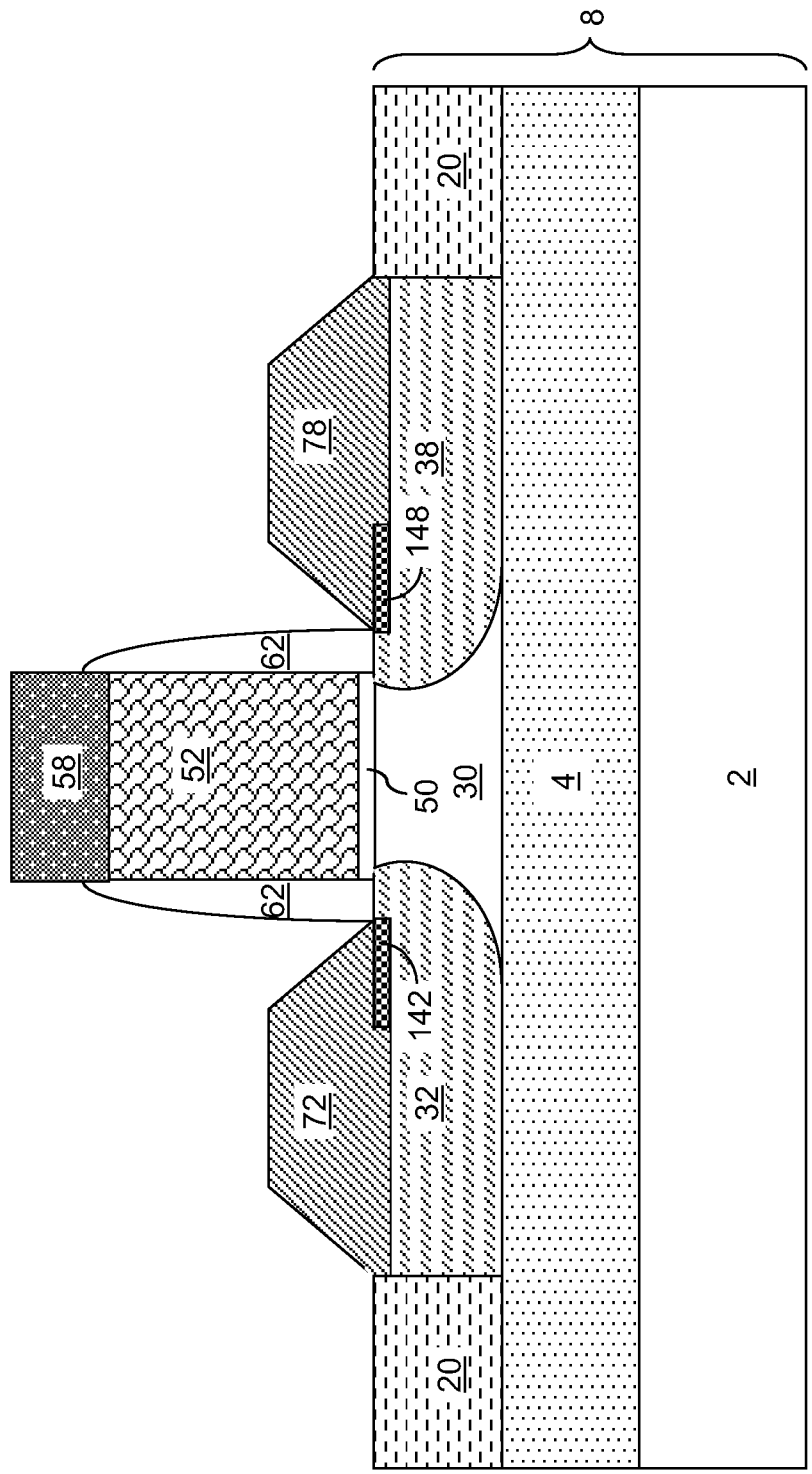
FIG. 17 is a vertical cross-sectional view of the second exemplary semiconductor structure after formation of underlying source/drain regions by an anneal according to the second embodiment of the present disclosure.

Referring FIG. 17, an underlying source region 32 and an underlying drain region 38 are formed employing the processing steps of FIG. 6. The first interfaces between the underlying source/drain regions (32, 38) and the raised source/drain regions (72, 78) are spaced from the gate electrode 52 of a field effect transistor by a greater lateral distance than the second interfaces between the underlying source/drain regions (32, 38) and the carbon-doped semiconductor material portions (142, 148).

Figure 18:
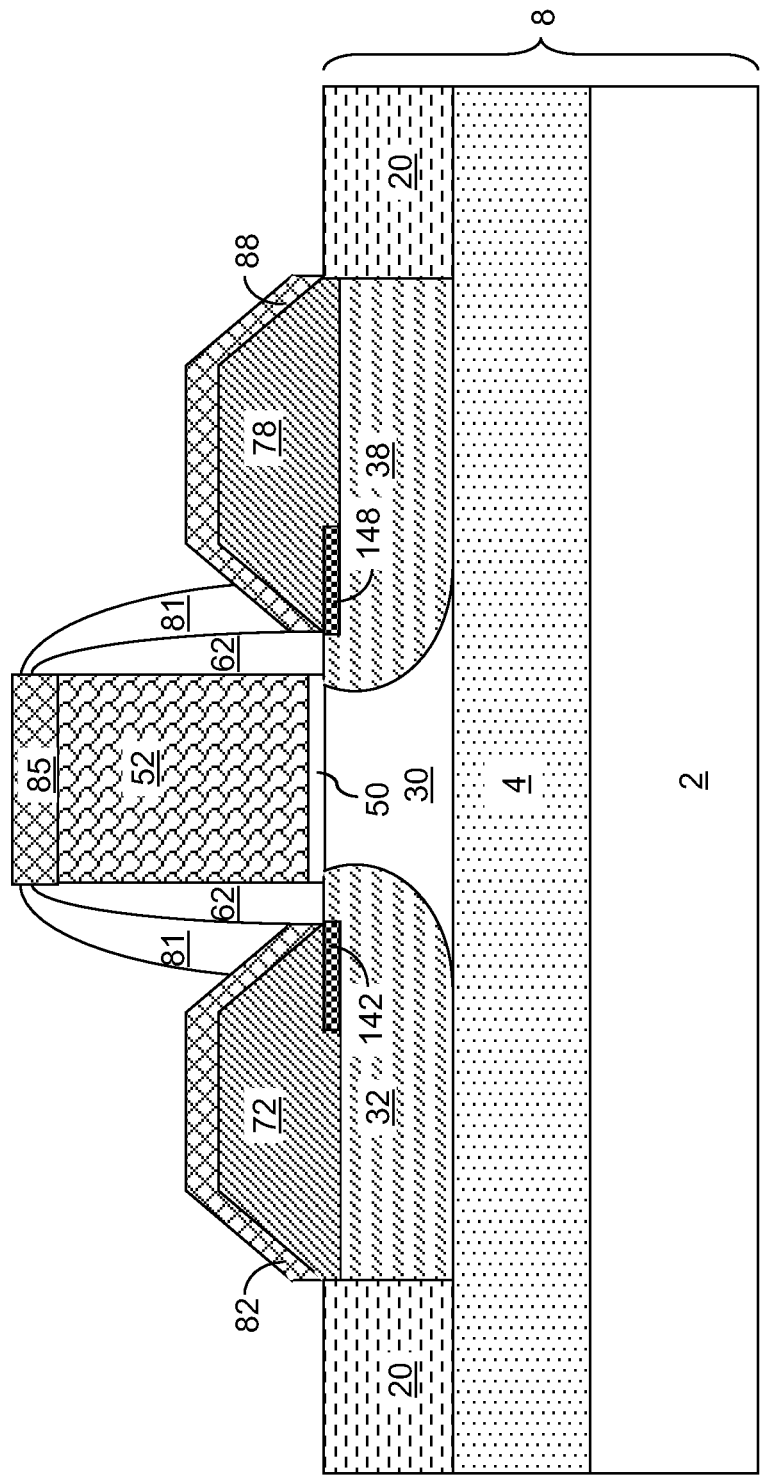
FIG. 18 is a vertical cross-sectional view of the second exemplary semiconductor structure after formation of metal semiconductor alloy portions according to the second embodiment of the present disclosure.

Referring to FIG. 18, an outer gate spacer 81 and various metal semiconductor alloy portions (82, 85, 88) can be formed employing the processing steps of FIG. 7.

Figure 19:
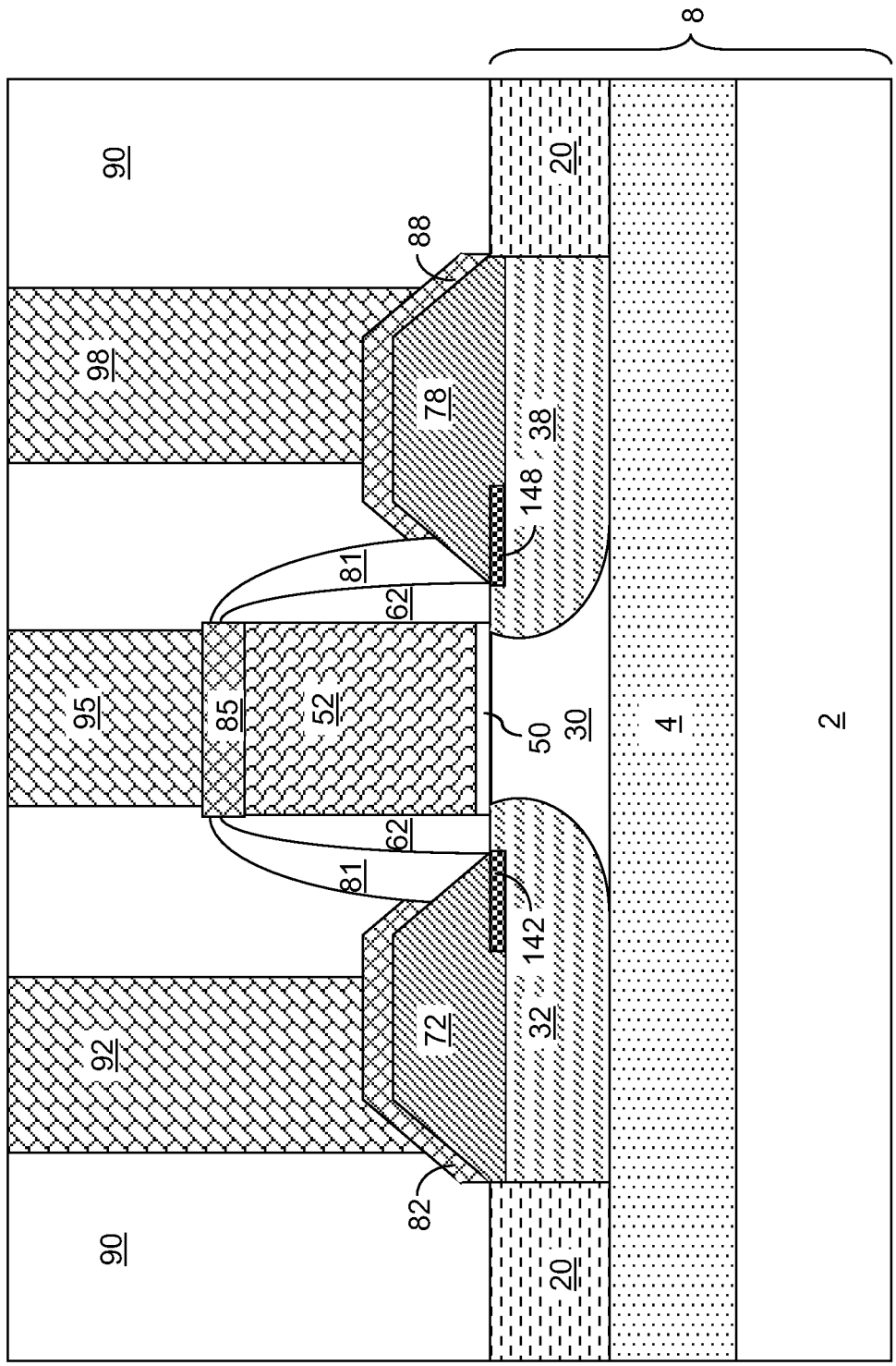
FIG. 19 is a vertical cross-sectional view of the second exemplary semiconductor structure after formation of a contact-level dielectric layer and various contact via structures according to the second embodiment of the present disclosure.

Referring to FIG. 19, a contact-level dielectric layer 90 and various contact via structures (82, 85, 88) can be formed employing the processing steps of FIG. 8. The underlying source/drain regions (32, 38) are located within the semiconductor-on-insulator (SOI) substrate 8, and contact a top surface of the buried insulator layer 20. The first interfaces and the second interfaces can be coplanar among one another. The top surfaces of the carbon-doped semiconductor material portions (142, 248) can be coplanar with the topmost surface of the semiconductor material portion 30. A bottom surface of each carbon-doped semiconductor material portion (142, 148) can be coplanar with a bottom surface of the raised source/drain regions (142, 148). The gate spacer 62 laterally contacts the gate electrode 52 of the field effect transistor. An edge of each carbon-doped semiconductor material portion (142, 148) coincides with an edge of the gate spacer 62. The top surface of each carbon-doped semiconductor material portion (142, 148) can be coplanar with a bottom surface of the gate spacer 62.

Figure 20:
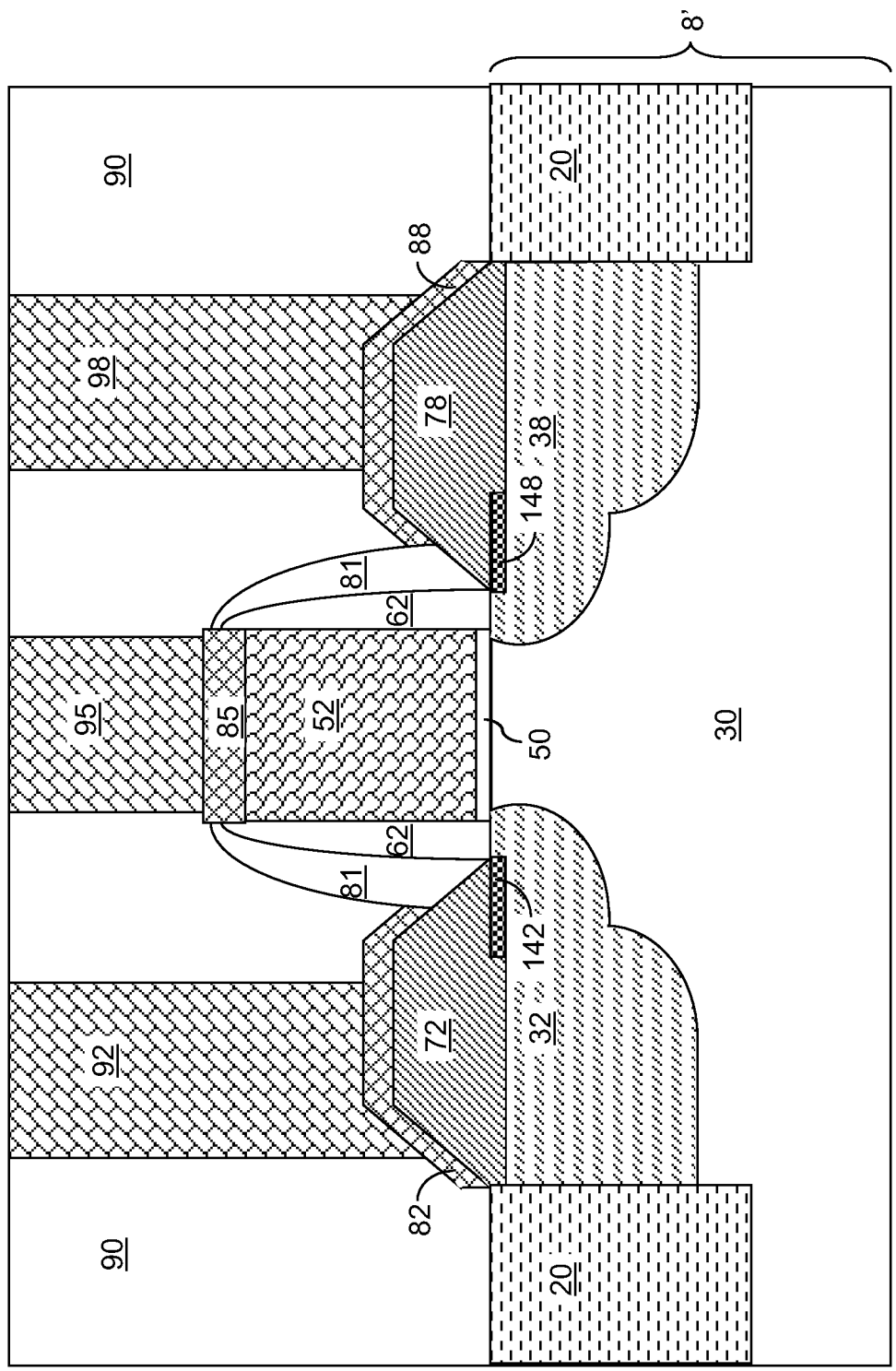
FIG. 20 is a vertical cross-sectional view of a first variation of the second exemplary semiconductor structure according to the second embodiment of the present disclosure.

Referring to FIG. 20, a first variation of the second exemplary semiconductor structure can be derived from the second exemplary semiconductor structure by replacing the SOI substrate 8 with a bulk substrate 8'.

Figure 21:
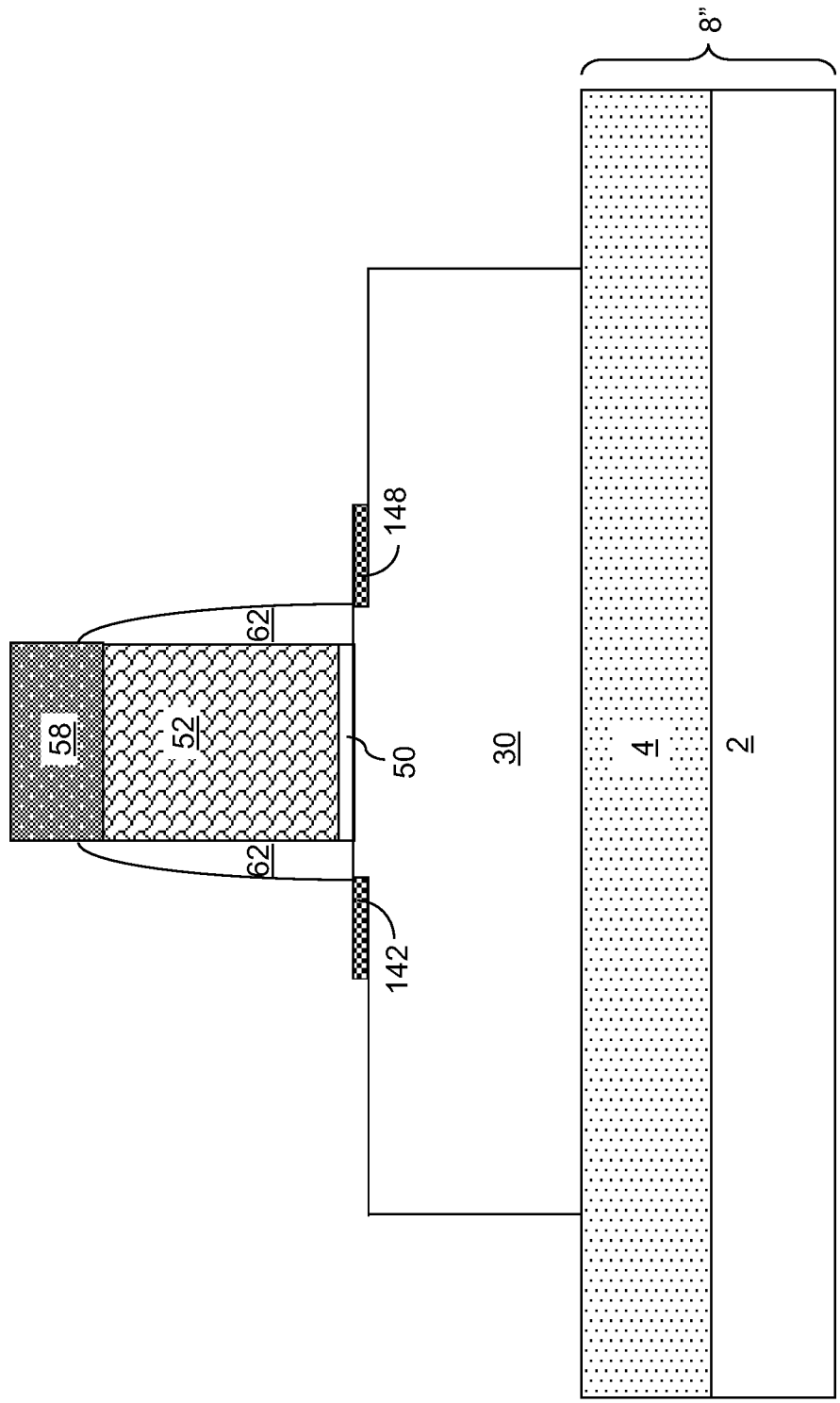
FIG. 21 is a vertical cross-sectional view of a second variation of the second exemplary semiconductor structure after removal of the disposable gate spacer according to the second embodiment of the present disclosure.

Referring to FIG. 21, a second variation of the second exemplary semiconductor structure can be derived from the second exemplary structure by not forming shallow trench isolation structures at the processing steps of FIG. 1. The processing steps of FIGS. 13-15 are subsequently performed.

Figure 22:
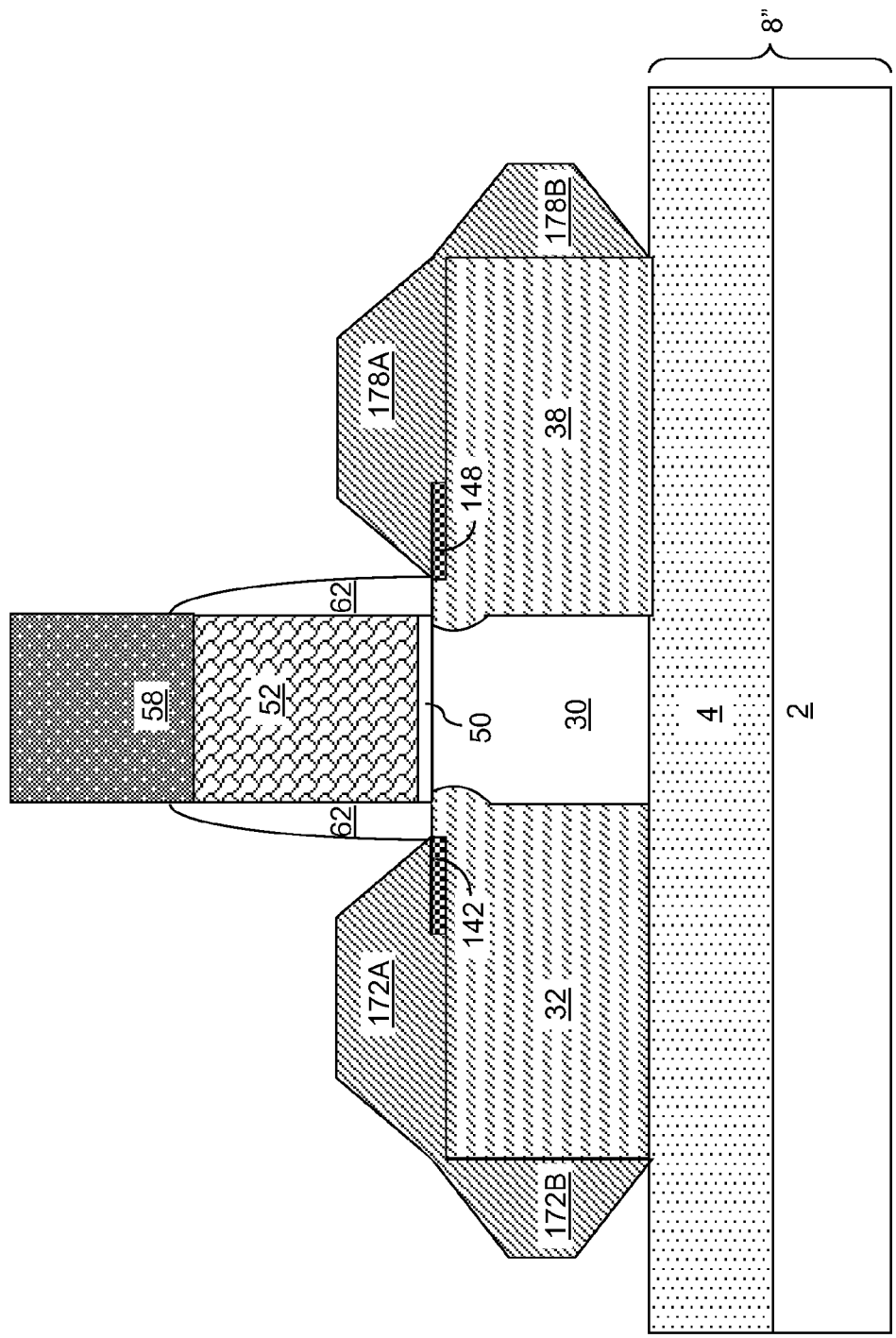
FIG. 22 is a vertical cross-sectional view of the second variation of the second exemplary semiconductor structure after formation of underlying source/drain regions by an anneal according to the second embodiment of the present disclosure.

Referring to FIG. 22, the processing steps of FIG. 16 are performed. The raised source/drain regions formed by selective deposition, such as selective epitaxy process described above, can include a top raised source region 172A, an end raised source region 172B, two side raised source regions 172C (See FIG. 23A), a top raised drain region 178A, an end raised drain region 178B, and two side raised drain regions 178C (See FIG. 23A).

Subsequently, the processing steps of FIG. 17 are performed. An underlying source region 32 is formed by diffusion of dopants of the second conductivity type from the top raised source region 172A, the end raised source region 172B, and the two side raised source regions 172C into a sub-portion of semiconductor fin, i.e., the semiconductor material portion 30. Likewise, an underlying drain region 38 is formed by diffusion of dopants of the second conductivity type from the top raised drain region 178A, the end raised drain region 178B, and the two side raised drain regions 178C into another sub-portion of semiconductor fin. The remaining portion of the semiconductor material portion 30 constitutes a body region of the fin field effect transistor.

Figure 23:
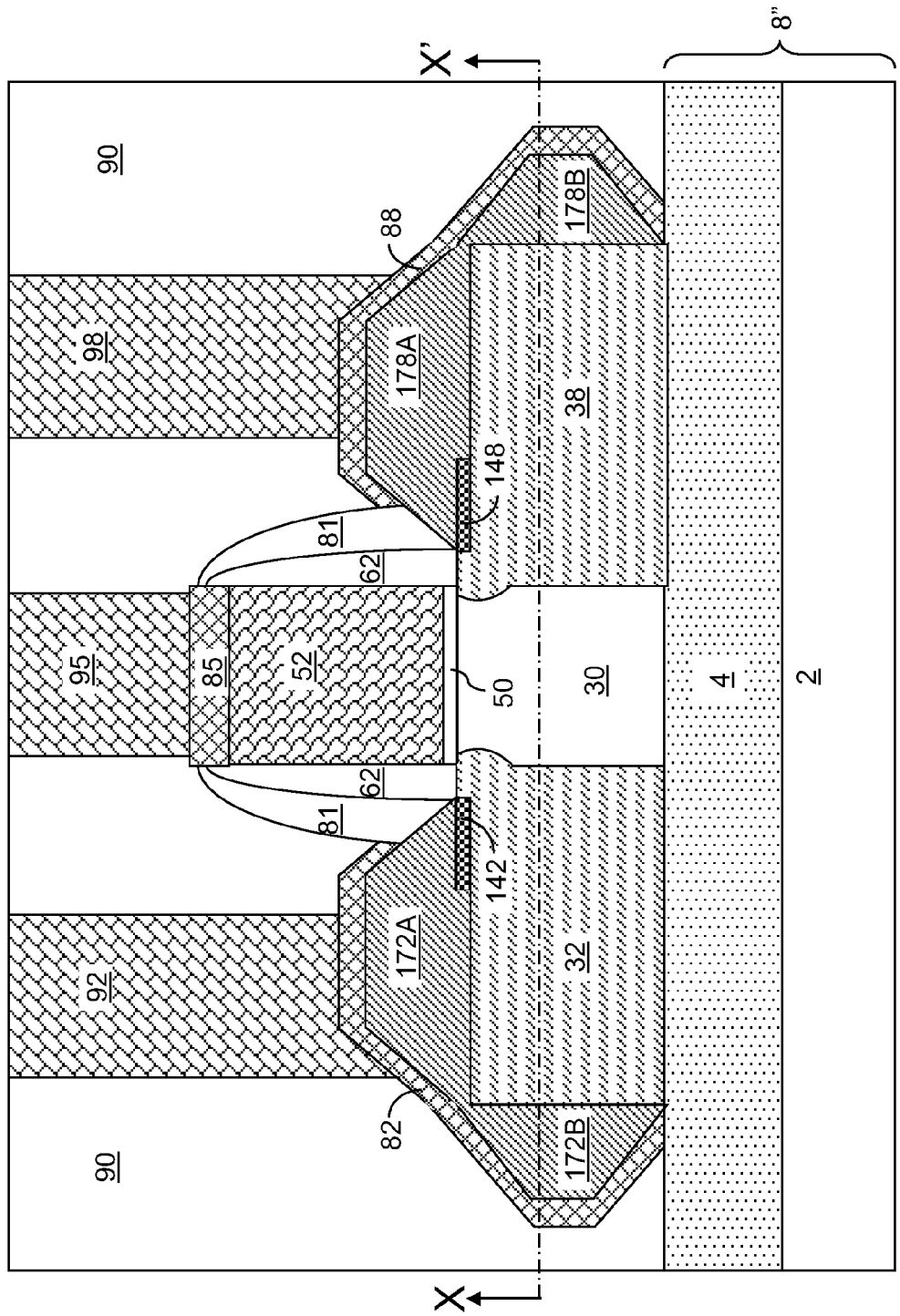
FIG. 23 is a vertical cross-sectional view of the second variation of the second exemplary semiconductor structure after formation of a contact-level dielectric layer and various contact via structures according to the second embodiment of the present disclosure.
Figure 23A:
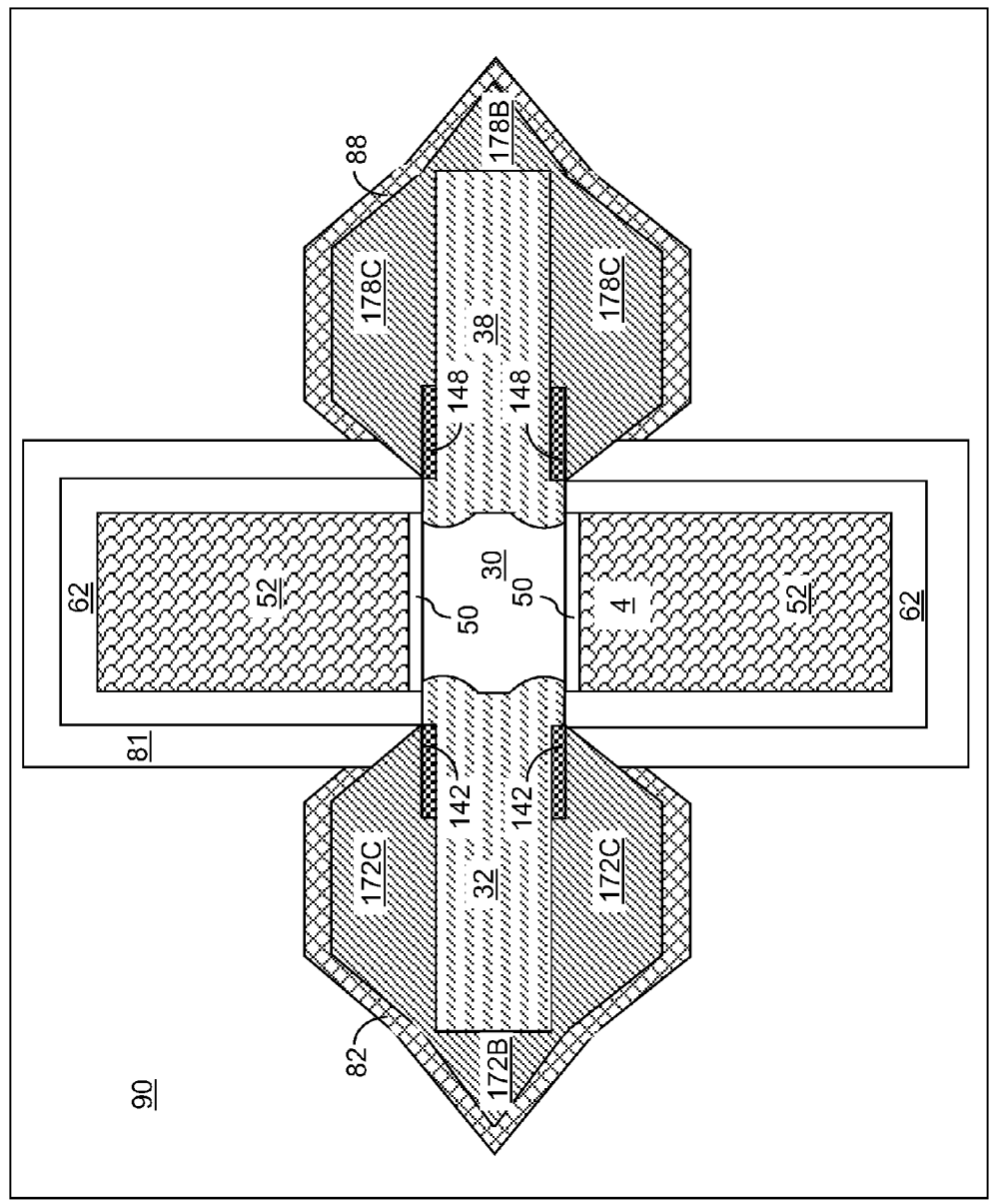
FIG. 23A is a horizontal cross-sectional view of the second variation of the second exemplary semiconductor structure of FIG. 23 along the plane X-X'.

Referring to FIGS. 23 and 23A, the processing steps of FIGS. 18 and 19 are performed to form a contact-level dielectric layer 90 and various contact via structures (92, 95, 98).

Figure 24:
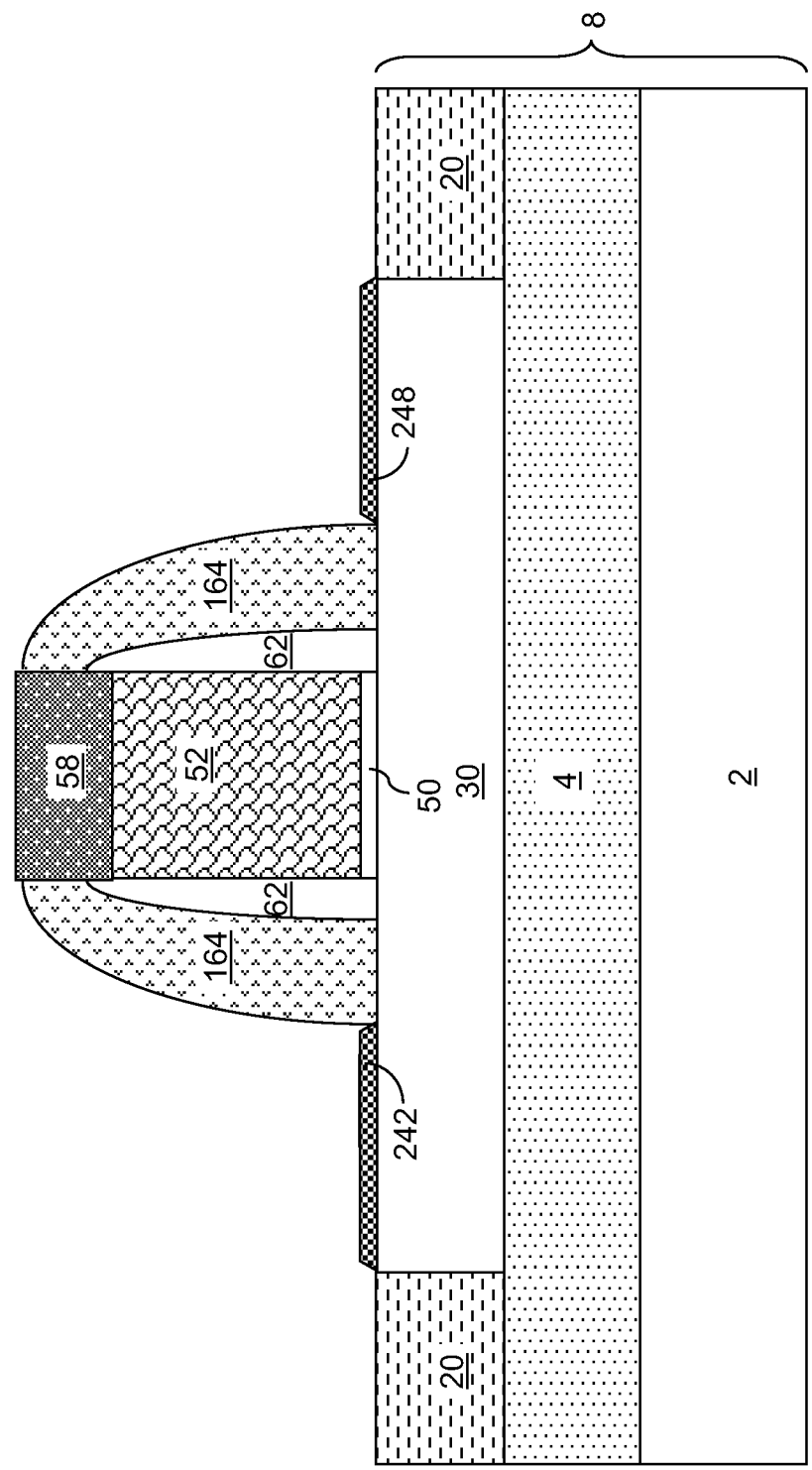
FIG. 24 is a vertical cross-sectional view of a third exemplary semiconductor structure after formation a disposable gate spacer and carbon-doped semiconductor material portions by selective epitaxy according to the third embodiment of the present disclosure.

Referring to FIG. 24, a third exemplary semiconductor structure according to the third embodiment of the present disclosure is derived from the first exemplary semiconductor structure of FIG. 1 by forming a disposable gate spacer 164. The disposable gate spacer 164 can include the same material as the disposable gate spacer 64 of the first and second embodiments, and can be formed, for example, employing the methods for forming the disposable gate spacer 64 as illustrated in FIG. 3.

After formation of the disposable gate spacer 164, carbon-doped semiconductor material portions are formed by selective deposition of a carbon-containing semiconductor material. The carbon-doped semiconductor material portions can include a source-side carbon-doped semiconductor material portion 242 and a drain-side carbon-doped semiconductor material portion 248. The carbon-doped semiconductor material portions (242, 248) can be formed employing the same method as the method for forming the carbon-doped semiconductor material layers (42L, 48L) illustrated in FIG. 2. The surfaces of the semiconductor material portion 30 on which the carbon-doped semiconductor material portions (242, 248) are formed are herein referred to first surfaces of the semiconductor material portion 30.

Figure 25:
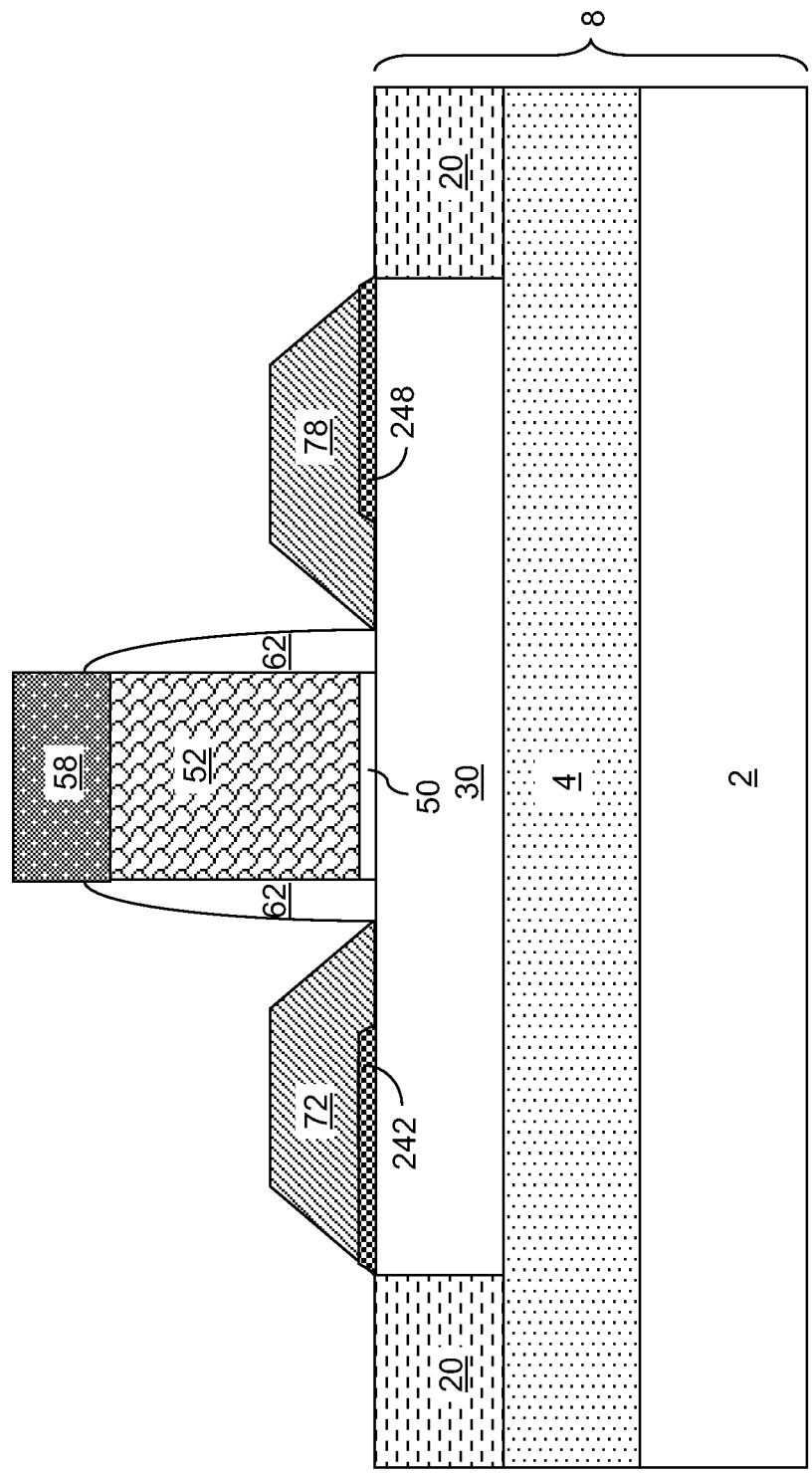
FIG. 25 is a vertical cross-sectional view of the third exemplary semiconductor structure after removal of a disposable gate spacer and formation of raised source/drain regions according to the third embodiment of the present disclosure.

Referring to FIG. 25, the disposable gate spacer 164 is removed selective to the gate spacer 62 and the carbon-doped semiconductor material portions (242, 248). Surfaces of the semiconductor material portion 30 are physically exposed within the area from which the disposable gate spacer 164 is removed. The physically exposed surfaces of the semiconductor material portion 30 are herein referred to as second surfaces of the semiconductor material portion 30.

Raised source/drain regions (72, 74) are formed employing the same method as in the first embodiment. First interfaces between the semiconductor material portion 30 and the raised source/drain regions (72, 78) are spaced from a gate electrode 52 of a field effect transistor by a lesser lateral distance than second interfaces between the semiconductor material portion 30 and the carbon-doped semiconductor material portions (242, 248).

Figure 26:
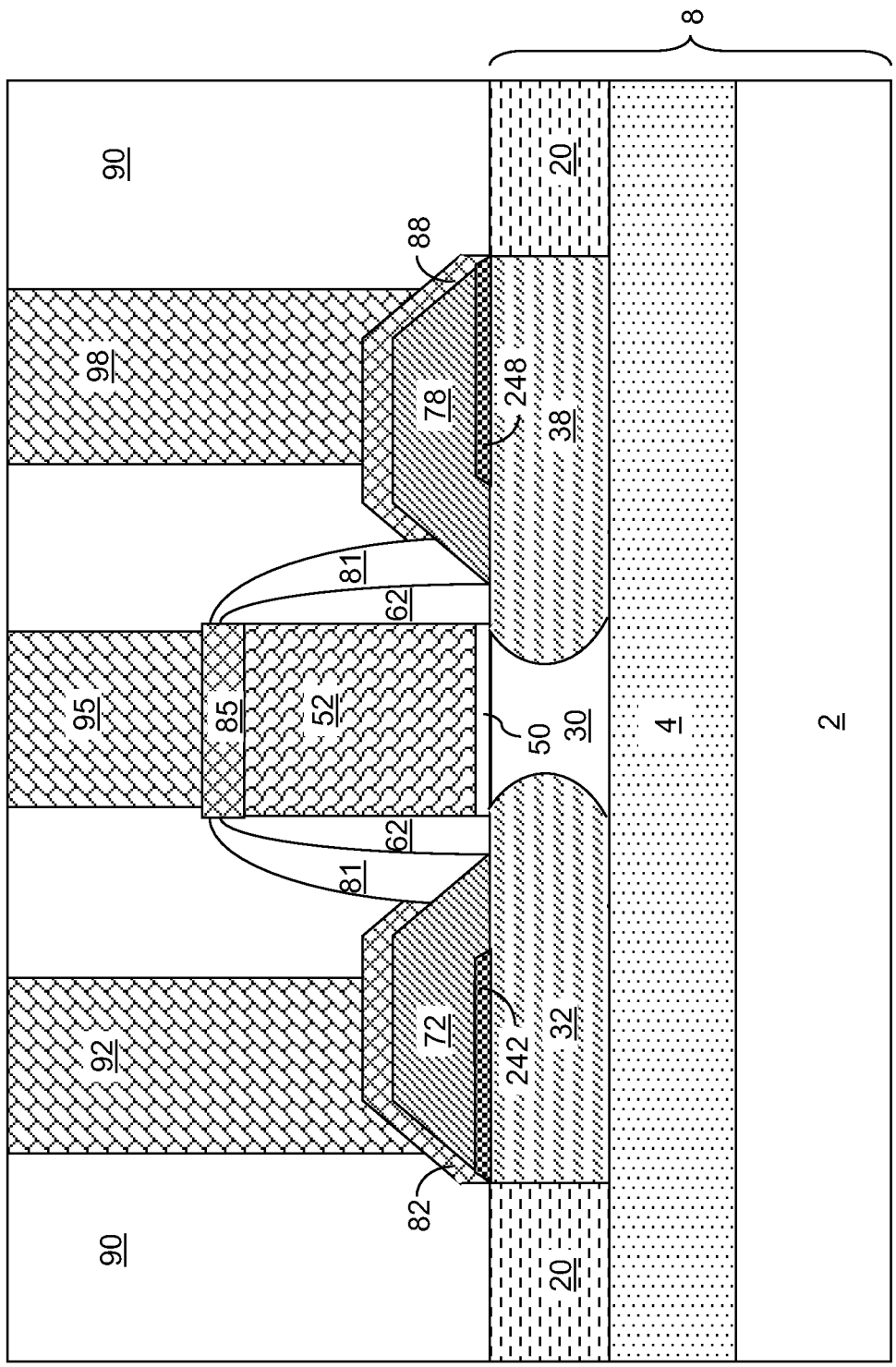
FIG. 26 is a vertical cross-sectional view of the third exemplary semiconductor structure after formation of underlying source/drain regions by an anneal, formation of metal semiconductor alloy portions, and formation of a contact-level dielectric layer and various contact via structures according to the third embodiment of the present disclosure.

Referring to FIG. 26, the processing steps of FIGS. 6-8 are performed to form underlying source/drain regions (32, 38) by an anneal, to form an outer gate spacer 81, to form various metal semiconductor alloy portions (82, 85, 88), and to form a contact-level dielectric layer 90 and various contact via structures (92, 95, 98). The underlying source region 32 and the underlying drain region 38 are located within a semiconductor-on-insulator (SOI) substrate 8, and contact the top surface of the buried insulator layer 4. First interfaces between the underlying source/drain regions (32, 38) and the raised source/drain regions (72, 78) are spaced from the gate electrode 52 of the field effect transistor by a lesser lateral distance than second interfaces between the underlying source/drain regions (32, 38) and the carbon-doped semiconductor material portions (242, 248).

Figure 27:
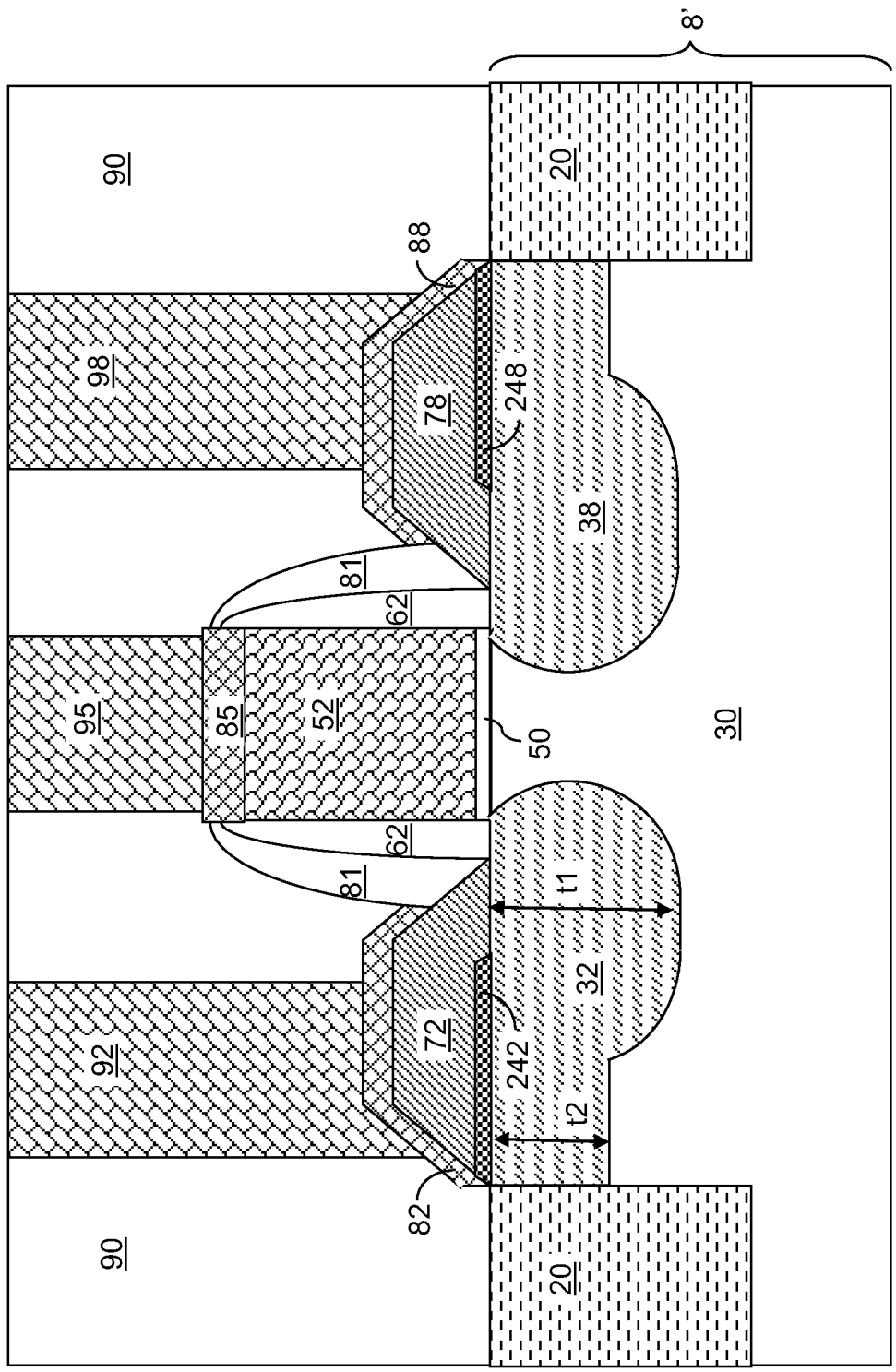
FIG. 27 is a vertical cross-sectional view of a first variation of the third exemplary semiconductor structure according to the third embodiment of the present disclosure.

Referring to FIG. 27, a first variation of the third exemplary semiconductor structure can be derived from the third exemplary semiconductor structure by replacing the SOI substrate 8 with a bulk substrate 8'. First interfaces between the underlying source/drain regions (32, 38) and the raised source/drain regions (72, 78) are spaced from the gate electrode 52 of the field effect transistor by a lesser lateral distance than second interfaces between the underlying source/drain regions (32, 38) and the carbon-doped semiconductor material portions (242, 248). A first portion of an underlying source/drain region (32, 38) that underlies a first interface has a greater thickness, e.g., a first thickness t1, than a second portion of the underlying source/drain region (32, 38) that underlies a second interface, which can have, for example, a second thickness t2.

Figure 28:
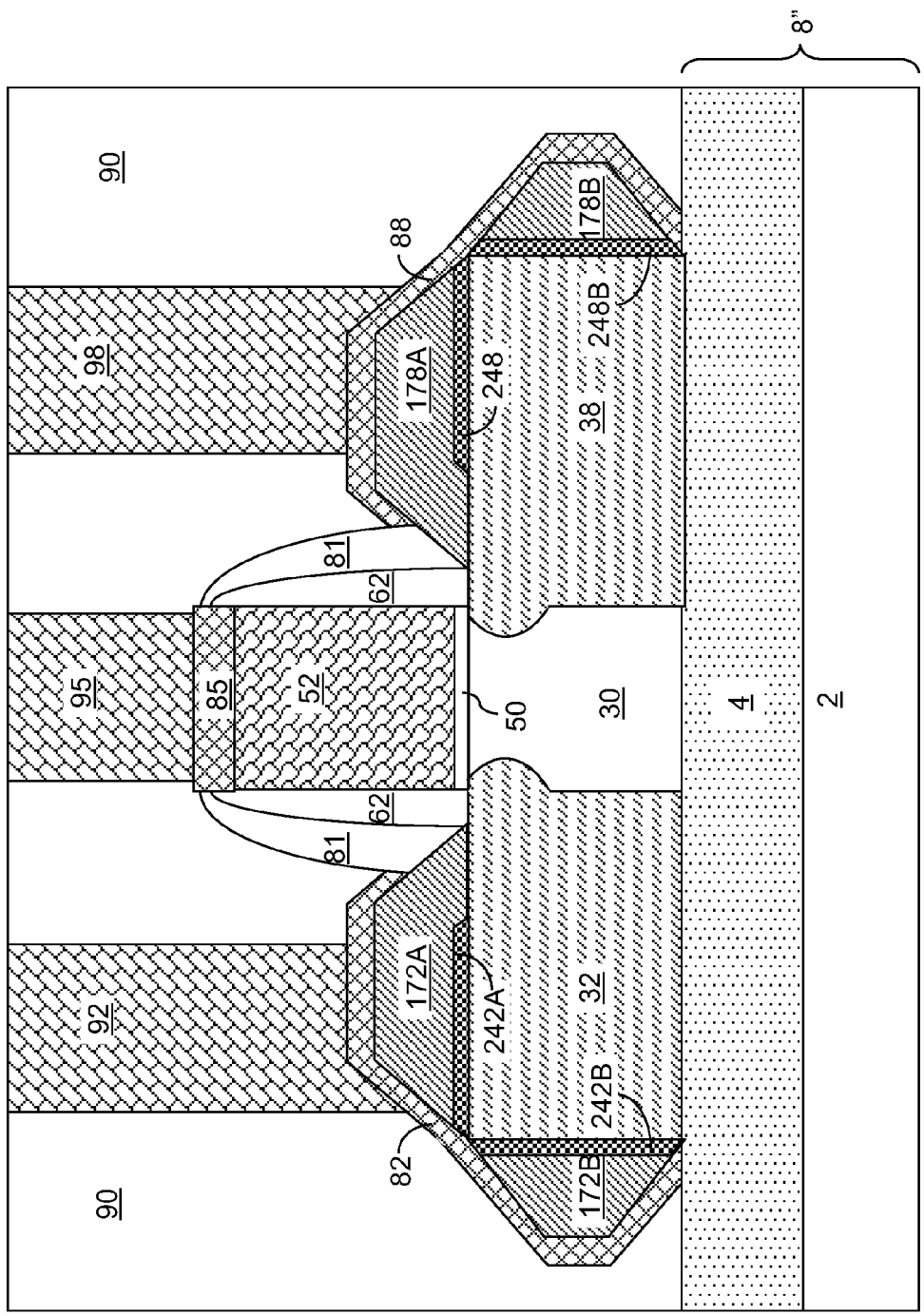
FIG. 28 is a vertical cross-sectional view of a second variation of the third exemplary semiconductor structure according to the third embodiment of the present disclosure.

Referring to FIG. 28, a second variation of the third exemplary semiconductor structure can be derived from the third exemplary structure by not forming shallow trench isolation structures at the processing steps of FIG. 1. The processing steps of FIGS. 2-8 are subsequently performed. The raised source/drain regions formed by selective deposition, such as selective epitaxy process described above, can include a top raised source region 172A, an end raised source region 172B, two side raised source regions (not shown; See FIG. 12A), a top raised drain region 178A, an end raised drain region 178B, and two side raised drain regions (not shown; See FIG. 12A). An underlying source region 32 is formed by diffusion of dopants of the second conductivity type from the top raised source region 172A, the end raised source region 172B, and the two side raised source regions into a sub-portion of semiconductor fin, i.e., the semiconductor material portion 30. Likewise, an underlying drain region 38 is formed by diffusion of dopants of the second conductivity type from the top raised drain region 178A, the end raised drain region 178B, and the two side raised drain regions into another sub-portion of semiconductor fin. The remaining portion of the semiconductor material portion 30 constitutes a body region of the fin field effect transistor.

Figure 29:
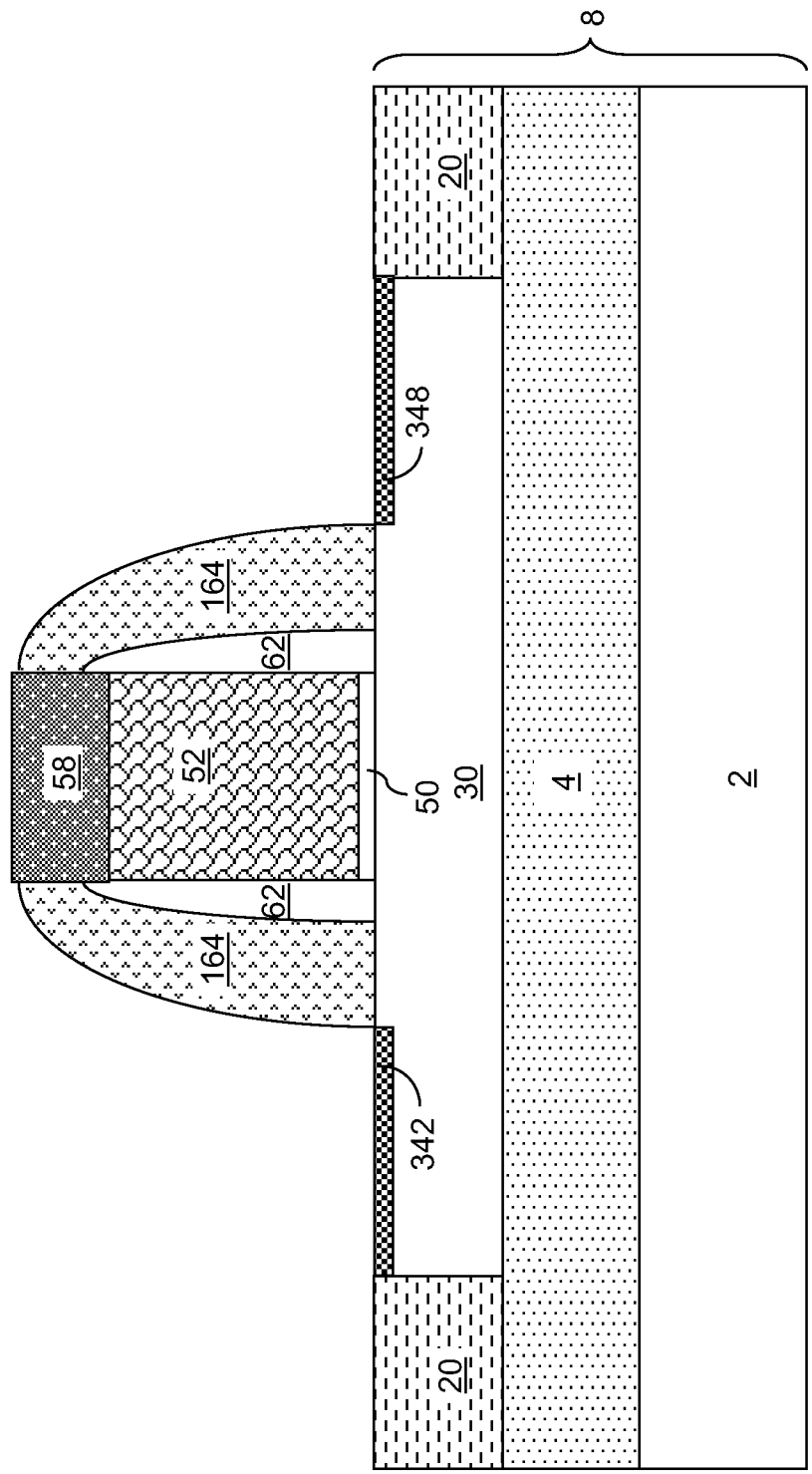
FIG. 29 is a vertical cross-sectional view of a fourth exemplary semiconductor structure after formation a disposable gate spacer and carbon-doped semiconductor material portions by plasma doping according to the fourth embodiment of the present disclosure.

Referring to FIG. 29, a fourth exemplary semiconductor structure according to the fourth embodiment of the present disclosure is derived from the first exemplary semiconductor structure of FIG. 1 by forming a disposable gate spacer 164. The disposable gate spacer 164 can include the same material as the disposable gate spacer 64 of the first and second embodiments, and can be formed, for example, employing the methods for forming the disposable gate spacer 64 as illustrated in FIG. 3.

After formation of the disposable gate spacer 164, carbon-doped semiconductor material portions are formed by plasma doping of surface sub-portions of the semiconductor material portion 30. The carbon-doped semiconductor material portions can include a source-side carbon-doped semiconductor material portion 342 and a drain-side carbon-doped semiconductor material portion 348. The carbon-doped semiconductor material portions (342, 348) can be formed employing the same method as the method for forming the carbon-doped semiconductor material layers (142L, 148L) illustrated in FIG. 13. The surfaces of the semiconductor material portion 30 on which the carbon-doped semiconductor material portions (342, 348) are present are herein referred to first surfaces of the semiconductor material portion 30.

Figure 30:
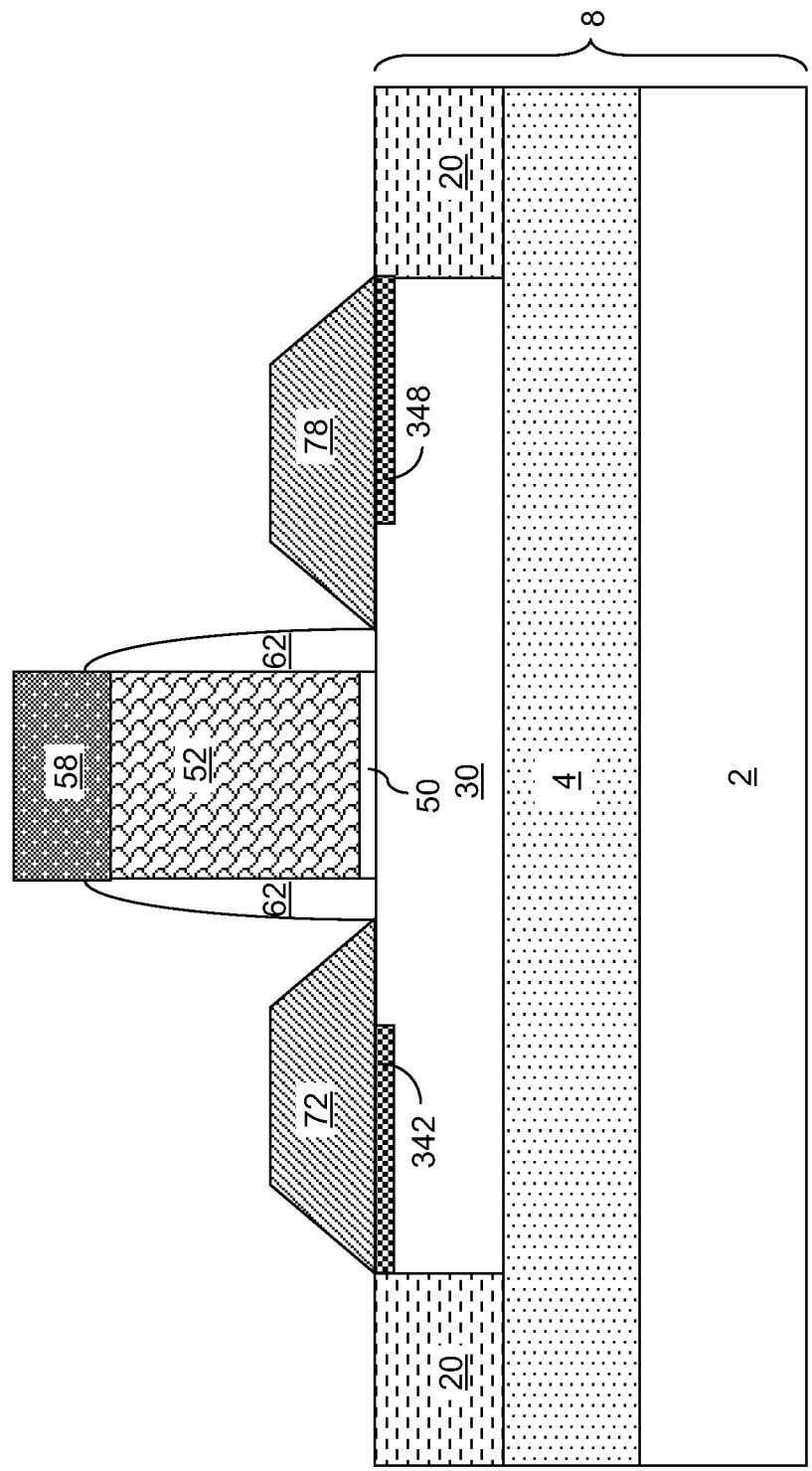
FIG. 30 is a vertical cross-sectional view of the fourth exemplary semiconductor structure after removal of a disposable gate spacer and formation of raised source/drain regions according to the fourth embodiment of the present disclosure.

Referring to FIG. 30, the disposable gate spacer 164 is removed selective to the gate spacer 62 and the carbon-doped semiconductor material portions (342, 348). Surfaces of the semiconductor material portion 30 are physically exposed within the area from which the disposable gate spacer 164 is removed. The physically exposed surfaces of the semiconductor material portion 30 are herein referred to as second surfaces of the semiconductor material portion 30.

Raised source/drain regions (72, 74) are formed employing the same method as in the second embodiment. First interfaces between the semiconductor material portion 30 and the raised source/drain regions (72, 78) are spaced from a gate electrode 52 of a field effect transistor by a lesser lateral distance than second interfaces between the semiconductor material portion 30 and the carbon-doped semiconductor material portions (342, 348).

Figure 31:
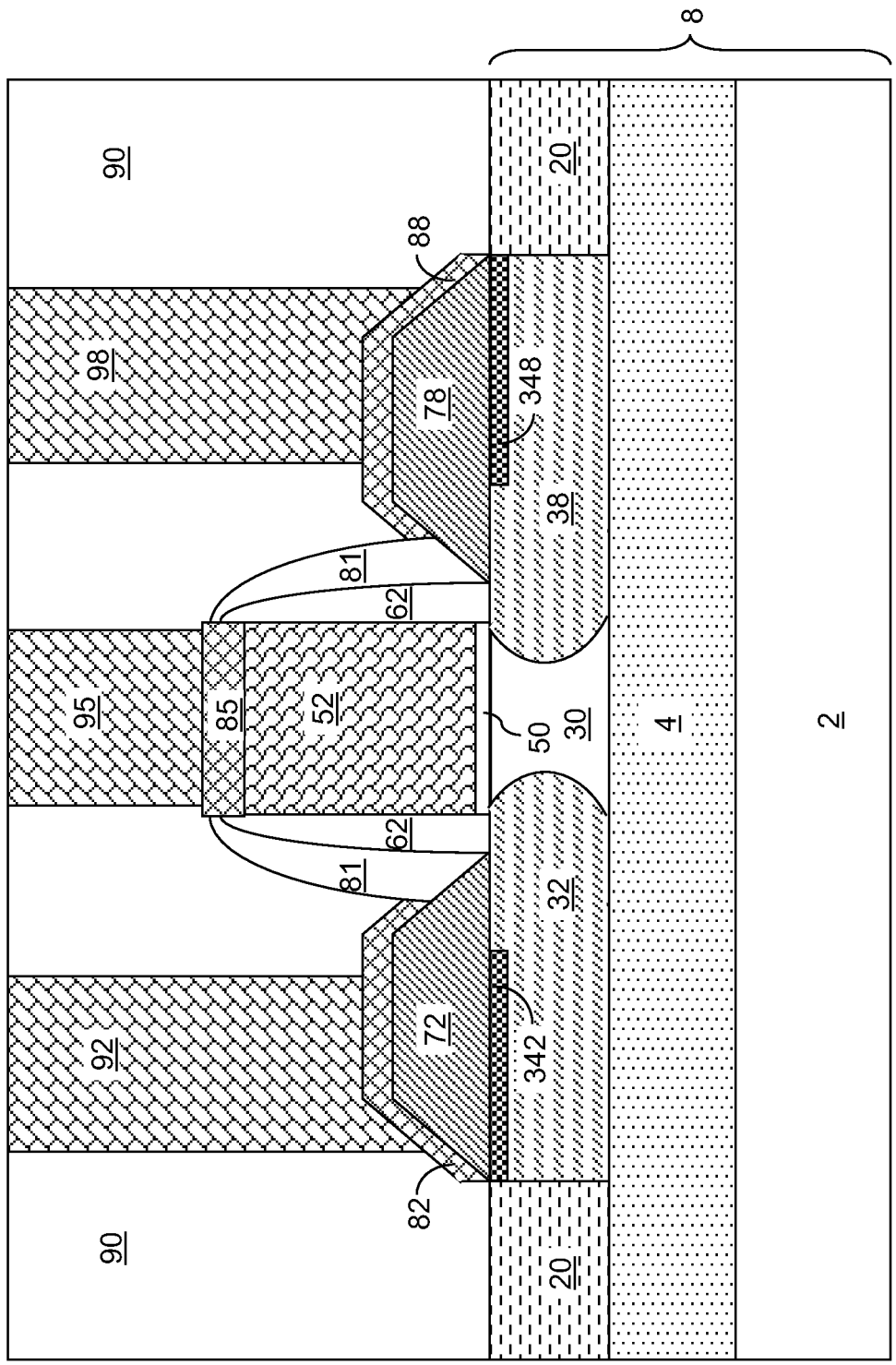
FIG. 31 is a vertical cross-sectional view of the fourth exemplary semiconductor structure after formation of underlying source/drain regions by an anneal, formation of metal semiconductor alloy portions, and formation of a contact-level dielectric layer and various contact via structures according to the fourth embodiment of the present disclosure.

Referring to FIG. 31, the processing steps of FIGS. 17-19 are performed to form underlying source/drain regions (32, 38) by an anneal, to form an outer gate spacer 81, to form various metal semiconductor alloy portions (82, 85, 88), and to form a contact-level dielectric layer 90 and various contact via structures (92, 95, 98). The underlying source region 32 and the underlying drain region 38 are located within a semiconductor-on-insulator (SOI) substrate 8, and contact the top surface of the buried insulator layer 4. First interfaces between the underlying source/drain regions (32, 38) and the raised source/drain regions (72, 78) are spaced from the gate electrode 52 of the field effect transistor by a lesser lateral distance than second interfaces between the underlying source/drain regions (32, 38) and the carbon-doped semiconductor material portions (242, 248).

Figure 32:
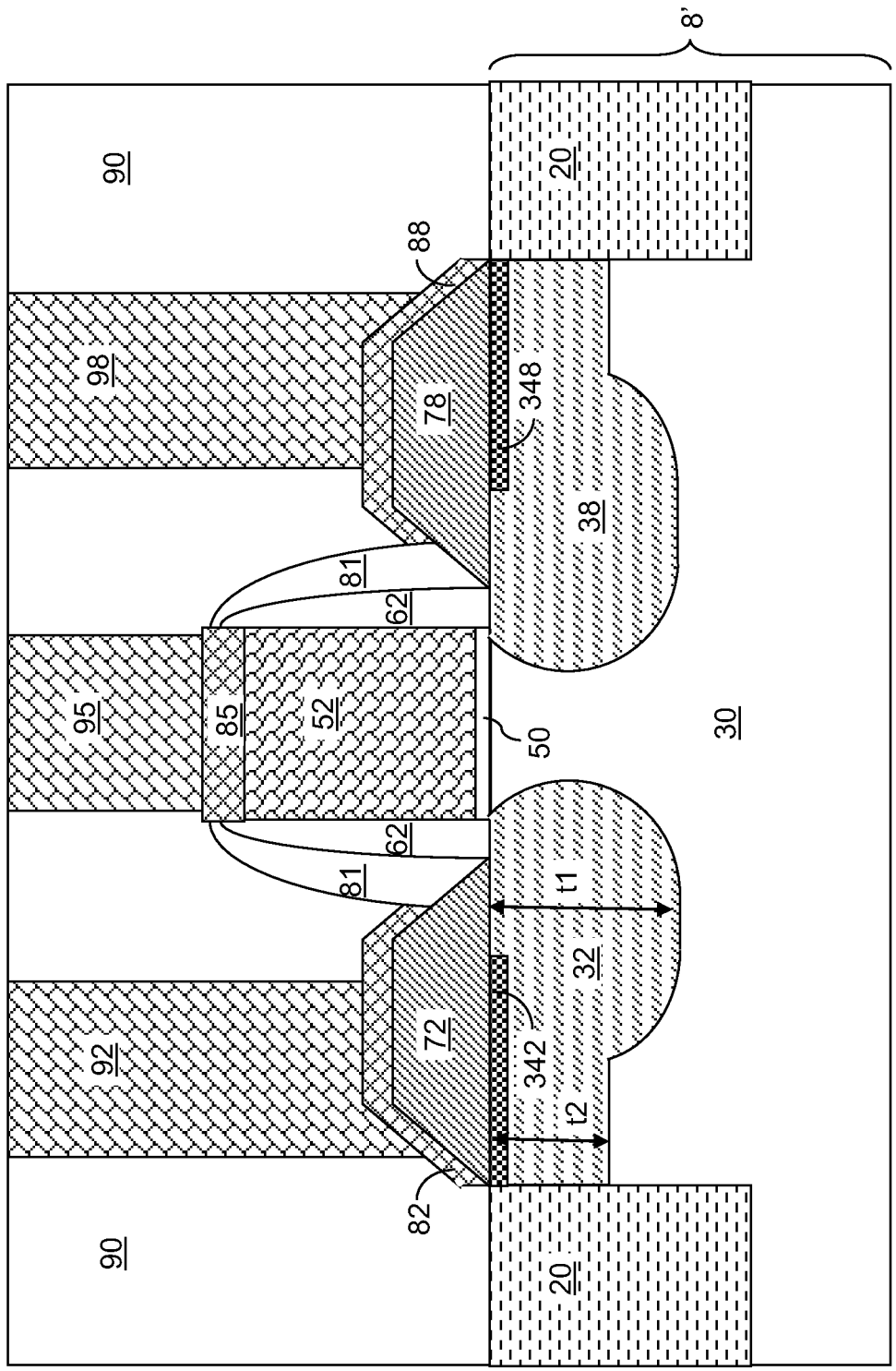
FIG. 32 is a vertical cross-sectional view of a first variation of the fourth exemplary semiconductor structure according to the fourth embodiment of the present disclosure.

Referring to FIG. 32, a first variation of the fourth exemplary semiconductor structure can be derived from the fourth exemplary semiconductor structure by replacing the SOI substrate 8 with a bulk substrate 8'. First interfaces between the underlying source/drain regions (32, 38) and the raised source/drain regions (72, 78) are spaced from the gate electrode 52 of the field effect transistor by a lesser lateral distance than second interfaces between the underlying source/drain regions (32, 38) and the carbon-doped semiconductor material portions (242, 248). A first portion of an underlying source/drain region (32, 38) that underlies a first interface has a greater thickness, e.g., a first thickness t1, than a second portion of the underlying source/drain region (32, 38) that underlies a second interface, which can have, for example, a second thickness t2.

Figure 33:
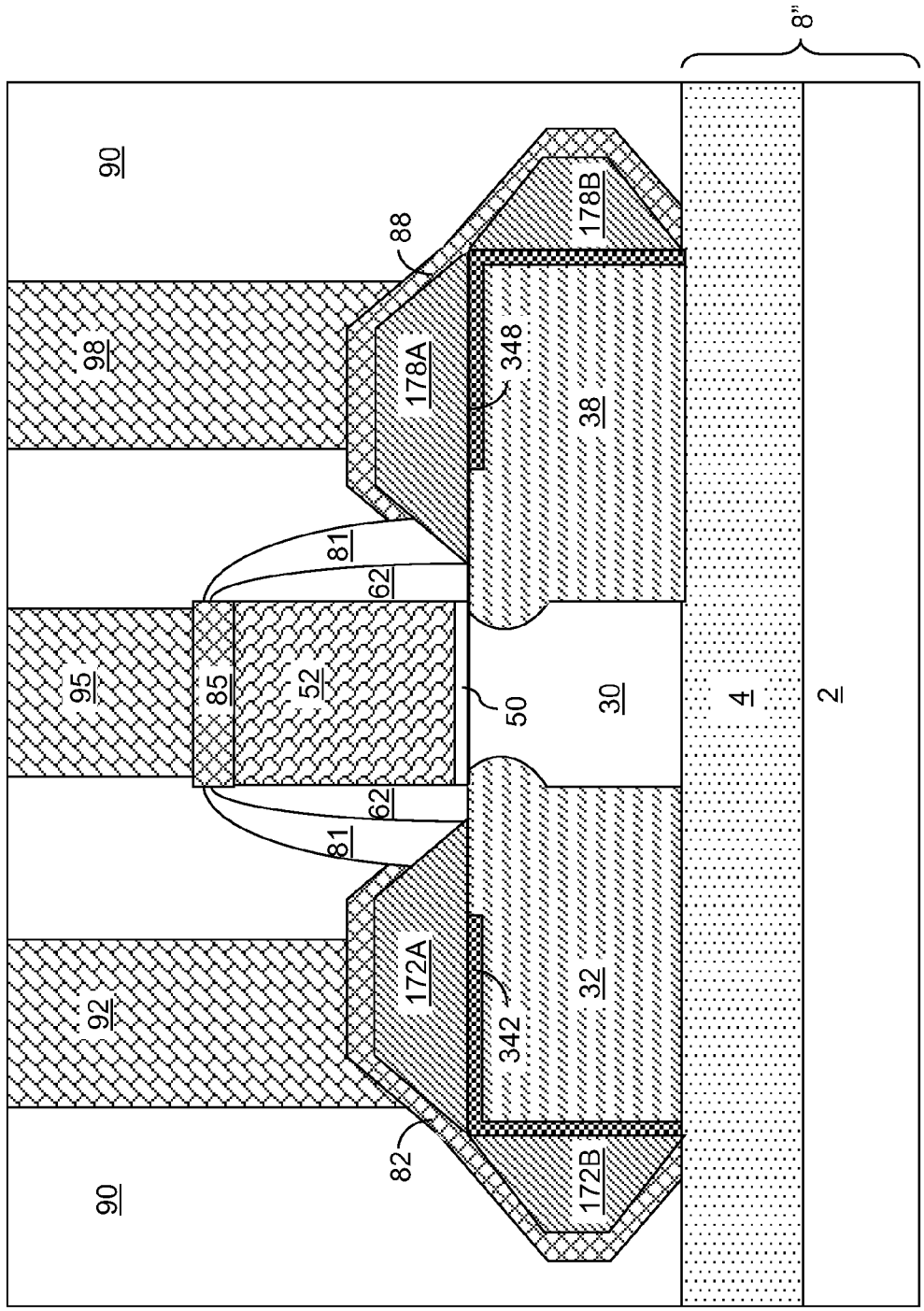
FIG. 33 is a vertical cross-sectional view of a second variation of the fourth exemplary semiconductor structure according to the fourth embodiment of the present disclosure.

Referring to FIG. 33, a second variation of the fourth exemplary semiconductor structure can be derived from the fourth exemplary structure by not forming shallow trench isolation structures at the processing steps of FIG. 1. The processing steps of FIGS. 13-19 are subsequently performed. The raised source/drain regions formed by selective deposition, such as selective epitaxy process described above, can include a top raised source region 172A, an end raised source region 172B, two side raised source regions (not shown; See FIG. 23A), a top raised drain region 178A, an end raised drain region 178B, and two side raised drain regions (not shown; See FIG. 23A). An underlying source region 32 is formed by diffusion of dopants of the second conductivity type from the top raised source region 172A, the end raised source region 172B, and the two side raised source regions into a sub-portion of semiconductor fin, i.e., the semiconductor material portion 30. Likewise, an underlying drain region 38 is formed by diffusion of dopants of the second conductivity type from the top raised drain region 178A, the end raised drain region 178B, and the two side raised drain regions into another sub-portion of semiconductor fin. The remaining portion of the semiconductor material portion 30 constitutes a body region of the fin field effect transistor.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of forming a semiconductor structure comprising:
   providing a semiconductor material portion laterally extending from a first sidewall surface to a second sidewall surface on a substrate;
   forming a gate stack including a gate dielectric and a gate electrode on said semiconductor material portion;
   forming a carbon-doped semiconductor material portion on a first surface of said semiconductor material portion; and
   forming at least one raised source/drain region directly on a surface of said carbon-doped semiconductor material portion and a second surface of said semiconductor material portion.

2. The method of claim 1, further comprising forming a gate spacer on sidewalls of said gate stack.

3. The method of claim 2, wherein the step of forming a carbon-doped semiconductor material portion further comprises:
   forming carbon-doped semiconductor material layers on an entirety of physically exposed surfaces of said semiconductor material portion, said carbon-doped semiconductor material layers laterally surrounding said gate stack and said gate spacer, wherein said entirety of physically exposed surfaces includes said first surface; and
   removing second portions of said carbon-doped semiconductor layers while not removing first portions of said carbon-doped semiconductor layers, wherein said second surface becomes physically exposed in a region from which said second portions of said carbon-doped semiconductor layers are removed.

4. The method of claim 3, further comprising forming a disposable gate spacer over said first portions of said carbon-doped semiconductor material layers, wherein said removing of said second portions of said carbon-doped semiconductor layers is performed employing said disposable gate spacer as an etch mask.

5. The method of claim 3, said first portions of said carbon-doped semiconductor material layers are adjacent to said gate spacer.

6. The method of claim 4, wherein said first portions of said carbon-doped semiconductor material layers and said second portions of said carbon-doped semiconductor material layers collectively constitute an entirety of said carbon-doped semiconductor material layers.

7. The method of claim 4, further comprising removing said disposable gate spacer selective to said first portions of said carbon-doped semiconductor material layers and said gate spacer, wherein said disposable gate spacer is removed after said step of removing said second portions of said carbon-doped semiconductor layers.

8. The method of claim 3, wherein said carbon-doped semiconductor material layers are formed by performing selective epitaxy of a carbon-doped semiconductor material directly on said entirety of physically exposed surfaces of said semiconductor material portion.

9. The method of claim 1, further comprising annealing said at least one raised source/drain regions at an elevated temperature, wherein electrical dopants within said at least one raised source/drain region diffuse into sub-portions of said semiconductor material portion.

10. The method of claim 9, wherein an entirety of said semiconductor material portion has a doping of a same conductivity type at a same dopant concentration prior to said annealing, and two p-n junctions are formed within said semiconductor material portion after said annealing.

11. The method of claim 9, wherein an underlying source region and an underlying drain region that have a doping of a same conductivity type as said at least one raised source/drain region are formed within said semiconductor material portion after said annealing.

12. The method of claim 1, wherein said at least one raised source/drain region is formed by performing a selective epitaxy.

13. The method of claim 2, further comprising forming an outer gate spacer on outer sidewalls of said gate spacer, said outer gate spacer in contact with said at least one raised source/drain region and said carbon-doped semiconductor material portion.

14. The method of claim 13, further comprising forming metal semiconductor alloy portions on said at least on raised source/drain region and said gate electrode in said gate stack.

15. The method of claim 2, further comprising:
   forming a disposable gate spacer around said gate spacer and directly on said second surface;
   forming said carbon-doped semiconductor material portion on said first surface; and
   removing said disposable gate spacer from above said second surface prior to said forming said at least one raised source/drain region.

16. The method of claim 15, wherein said carbon-doped semiconductor material portion is laterally spaced from said gate spacer by said disposable gate spacer.

* * * * *